United States Patent
Itoh et al.

(10) Patent No.: US 10,693,449 B2
(45) Date of Patent: Jun. 23, 2020

(54) SWITCHING CIRCUIT DEVICE, STEP-DOWN DC-DC CONVERTER, AND ELEMENT UNIT

(71) Applicant: Tohoku University, Miyagi (JP)

(72) Inventors: Kazuki Itoh, Miyagi (JP); Tetsuo Endoh, Miyagi (JP)

(73) Assignee: TOHOKU UNIVERSITY, Miyagi (JP)

(*) Notice: Subject to any disclaimer, the term of this patent is extended or adjusted under 35 U.S.C. 154(b) by 0 days.

(21) Appl. No.: 16/335,421

(22) PCT Filed: Sep. 15, 2017

(86) PCT No.: PCT/JP2017/033609
§ 371 (c)(1),
(2) Date: Jun. 28, 2019

(87) PCT Pub. No.: WO2018/056234
PCT Pub. Date: Mar. 29, 2018

(65) Prior Publication Data
US 2019/0334516 A1 Oct. 31, 2019

(30) Foreign Application Priority Data
Sep. 23, 2016 (JP) .................. 2016-186254

(51) Int. Cl.
*H02M 3/158* (2006.01)
*H03K 17/06* (2006.01)
(Continued)

(52) U.S. Cl.
CPC ......... *H03K 17/063* (2013.01); *H01L 27/088* (2013.01); *H01L 29/0847* (2013.01);
(Continued)

(58) Field of Classification Search
CPC ........ H02M 1/08; H02M 1/096; H02M 3/158; H02M 3/156; H02M 2001/0054;
(Continued)

(56) References Cited

U.S. PATENT DOCUMENTS

2007/0013350 A1* 1/2007 Tang ............... H02M 3/1584
323/237
2007/0182390 A1* 8/2007 Ishii ................ H03K 17/163
323/282
(Continued)

FOREIGN PATENT DOCUMENTS

JP   H0818419 A   1/1996
JP   2010016035 A  1/2010
(Continued)

OTHER PUBLICATIONS

Sakui, K., et al., "A Compact Space and Efficient Drain Current Design for Multipillar Vertical MOSFETs," IEEE Transactions on Electron Devices, vol. 57, No. 8, Aug. 2010.

*Primary Examiner* — Alex Torres-Rivera
(74) *Attorney, Agent, or Firm* — Fox Rothschild LLP; Robert J. Sacco; Carol E. Thorstad-Forsyth

(57) ABSTRACT

A switching circuit device includes high-side and low-side switching element circuits, and high-side and low-side drive circuits. The high-side switching element circuit includes a high-side switching element connected between an output terminal and a high-voltage terminal of a high voltage source. The low-side switching element circuit includes a low-side switching element connected between the output terminal and a reference potential terminal. The high-side drive circuit turns on the high-side switching element. The low-side drive circuit turns on the low-side switching element. The high-side drive circuit includes a bootstrap capacitor connected to a drive power source. The bootstrap capacitor is charged while the low-side switching element is
(Continued)

ON. The high-side drive circuit applies a gate voltage to the high-side switching element while the low-side switching element is OFF. The gate voltage is defined by adding a voltage of the output terminal to a voltage of the bootstrap capacitor.

11 Claims, 14 Drawing Sheets

(51) Int. Cl.
    *H01L 27/088* (2006.01)
    *H01L 29/08* (2006.01)
    *H01L 29/10* (2006.01)
    *H01L 29/417* (2006.01)
    *H01L 29/423* (2006.01)
    *H01L 29/78* (2006.01)
    *H02M 1/08* (2006.01)
    *H02M 1/00* (2006.01)

(52) U.S. Cl.
    CPC .... *H01L 29/1037* (2013.01); *H01L 29/41741* (2013.01); *H01L 29/42356* (2013.01); *H01L 29/7827* (2013.01); *H02M 1/08* (2013.01); *H02M 3/158* (2013.01); *H02M 3/1588* (2013.01); *H02M 2001/0054* (2013.01); *H03K 2217/0063* (2013.01); *H03K 2217/0072* (2013.01)

(58) Field of Classification Search
    CPC ........ H02M 3/1588; H02M 2001/0006; H03K 17/063; H03K 2217/0063; H03K 2217/0072; H03K 2217/0036; H03K 2217/0081; H01L 27/088; H01L 29/0847; H01L 29/1037; H01L 29/41741; H01L 29/42356; H01L 29/7827; H01L 21/823487

See application file for complete search history.

(56) References Cited

U.S. PATENT DOCUMENTS

| | | | | |
|---|---|---|---|---|
| 2008/0226013 | A1* | 9/2008 | Deane | G11C 19/00 377/70 |
| 2008/0253151 | A1* | 10/2008 | Bahramian | H02M 1/08 363/22 |
| 2009/0315595 | A1* | 12/2009 | Nakagawa | H03K 17/063 327/109 |
| 2010/0052648 | A1* | 3/2010 | Iwabuchi | H02M 7/538 323/351 |
| 2010/0271079 | A1* | 10/2010 | Choi | H03K 17/063 327/108 |
| 2011/0188218 | A1* | 8/2011 | Hsing | H01R 9/00 361/772 |
| 2013/0076322 | A1* | 3/2013 | Tateno | H02M 1/38 323/271 |
| 2016/0043624 | A1* | 2/2016 | Jarvinen | H02M 1/084 323/271 |
| 2016/0072312 | A1* | 3/2016 | Ichikawa | H02M 3/1582 307/104 |
| 2016/0087529 | A1 | 3/2016 | Sakai et al. | |
| 2016/0118894 | A1* | 4/2016 | Zhang | H02M 1/08 323/271 |
| 2017/0194860 | A1* | 7/2017 | Oak | H02M 3/158 |
| 2019/0238129 | A1* | 8/2019 | Fukushima | H02M 3/158 |

FOREIGN PATENT DOCUMENTS

| | | |
|---|---|---|
| JP | 2016158457 A | 9/2016 |
| WO | 2009/081619 A1 | 7/2009 |
| WO | 2011/043402 A1 | 4/2011 |
| WO | 2015/079762 A1 | 6/2015 |

* cited by examiner

SWITCHING CIRCUIT DEVICE, STEP-DOWN DC-DC CONVERTER, AND ELEMENT UNIT

TECHNICAL FIELD

The present invention relates to a switching circuit device, a step-down DC-DC converter, and an element unit.

BACKGROUND ART

In a semiconductor integrated circuit such as a microprocessor unit, a DC voltage supplied from an electronic circuit substrate on which the semiconductor integrated circuit is mounted is stepped down and converted into a voltage corresponding to the wiring width of a semiconductor circuit or the like. Although there are various types of step-down DC-DC converters for converting the voltage in this manner, the synchronous rectification type is often used for microprocessor units and the like due to excellent efficiency.

For example, a synchronous rectification step-down DC-DC converter described in Patent Literature 1 includes a switching circuit device having a high-side switching element and a low-side switching element connected in series between a high-voltage terminal of a high voltage source that outputs a voltage of a conversion source and the ground and a drive circuit or the like for turning on and off these elements, and includes a smoothing circuit connected to a connection point of the high-side switching element and the low-side switching element and configured to smooth the voltage output from the switching circuit device. A p-type MOSFET (metal-oxide-semiconductor field-effect transistor) is used as the high-side switching element connected to the high-voltage terminal side, and an n-type MOSFET is used as the low-side switching element connected to the ground (low-voltage) side.

CITATION LIST

Patent Literature

Patent Literature 1: Japanese Patent Application Laid-Open No. 8-18419

SUMMARY OF INVENTION

Technical Problem

In order to turn on the high-side switching element, a gate voltage higher than the voltage of the conversion source applied to a drain terminal is required. This is the reason why the p-type MOSFET is used as the high-side switching element. However, the p-type MOSFET is large in ON resistance compared to the n-type MOSFET. Therefore, there is a problem that the loss in the high-side switching element is large and the efficiency as the switching circuit device is poor. In addition, there is another problem that the element size of the p-type MOSFET required for obtaining desired drain current (IDS) is larger than that of the n-type MOSFET.

In view of the above-mentioned circumstances, the present invention intends to provide a switching circuit device capable of enhancing the efficiency and a step-down DC-DC converter using the switching circuit device. Further, the present invention intends to provide an element unit suitable for the switching circuit device or the like.

Solution to Problem

A switching circuit device according to the present invention includes: a high-side switching element circuit including a high-side switching element connected between an output terminal and a high-voltage terminal of a high voltage source, the high-side switching element having an n-type metal-oxide-semiconductor field-effect transistor; a low-side switching element circuit including a low-side switching element connected between the output terminal and a reference potential terminal, the low-side switching element having an n-type metal-oxide-semiconductor field-effect transistor; a high-side drive circuit configured to turn on and off the high-side switching element; and a low-side drive circuit configured to turn on and off the low-side switching element. The high-side drive circuit includes a bootstrap circuit having a bootstrap capacitor connected to a drive power source, the bootstrap capacitor being configured to be charged while the low-side switching element is ON. The high-side drive circuit is configured to apply a gate voltage to the high-side switching element while the low-side switching element is OFF, the gate voltage being defined by adding a voltage of the output terminal to a voltage between first and second terminals of the bootstrap capacitor.

Further, a step-down DC-DC converter according to the present invention includes the switching circuit device with a configuration described above, and a smoothing part including a capacitor and a choke coil connected to the output terminal.

An element unit according to the present invention includes a substrate having one surface on which an impurity diffusion layer is provided, a first transistor array, a second transistor array, a drain connection part, and a source connection part. The first transistor array serves as a first metal oxide semiconductor transistor element and includes a plurality of first semiconductor pillars, a first array gate electrode, and a plurality of gate insulation films. The plurality of first semiconductor pillars is aligned in a line in a first direction, each first semiconductor pillar including: a semiconductor region as a channel provided at a central portion of each first semiconductor pillar; a drain region provided at a first end of each first semiconductor pillar; and a source region provided at a second end of each first semiconductor pillar such that the source region is connected to the impurity diffusion layer. The first array gate electrode surrounds central portions of the plurality of first semiconductor pillars. The plurality of gate insulation films is respectively provided between the plurality of first semiconductor pillars and the first array gate electrode. The second transistor array serves as a second metal oxide semiconductor transistor element which is identical in polarity to the first metal oxide semiconductor transistor element. The second transistor array includes a plurality of second semiconductor pillars, a second array gate electrode, and a plurality of gate insulation films. The plurality of second semiconductor pillars is aligned in a line in the first direction, each second semiconductor pillar including: a semiconductor region as a channel provided at a central portion of each second semiconductor pillar; a source region provided at a first end of each second semiconductor pillar; and a drain region provided at a second end of each second semiconductor pillar such that the drain region is connected to the impurity diffusion layer. The second array gate electrode surrounds central portions of the plurality of second semiconductor pillars. The plurality of gate insulation films is respectively provided between the plurality of second semiconductor pillars and the second array gate electrode. The drain connection part electrically connects respective first ends of the plurality of first semiconductor pillars. The source connection part electrically connects respective first ends of the plurality of second semiconductor pillars.

Advantageous Effects of Invention

According to the switching circuit device of the present invention, the high-side switching element circuit includes high-side switching elements having n-type MOSFETs smaller in ON resistance and these elements are turned on upon application of a charging voltage of the bootstrap capacitor. With this structure, it is possible to enhance the efficiency of the switching circuit device without increasing the size of the high-side switching element.

In addition, according to the step-down DC-DC converter of the present invention, the high-side switching element circuit includes high-side switching elements having n-type MOSFETs smaller in ON resistance and these elements are turned on upon application of the charging voltage of the bootstrap capacitor. With this structure, it is possible to convert the voltage efficiently.

The element unit according to the present invention can reduce the series resistance between the first MOS transistor and the second MOS transistor connected in series, and can be preferably used for the switching circuit device or the like.

DESCRIPTION OF EMBODIMENTS

First Embodiment

Figure 1:
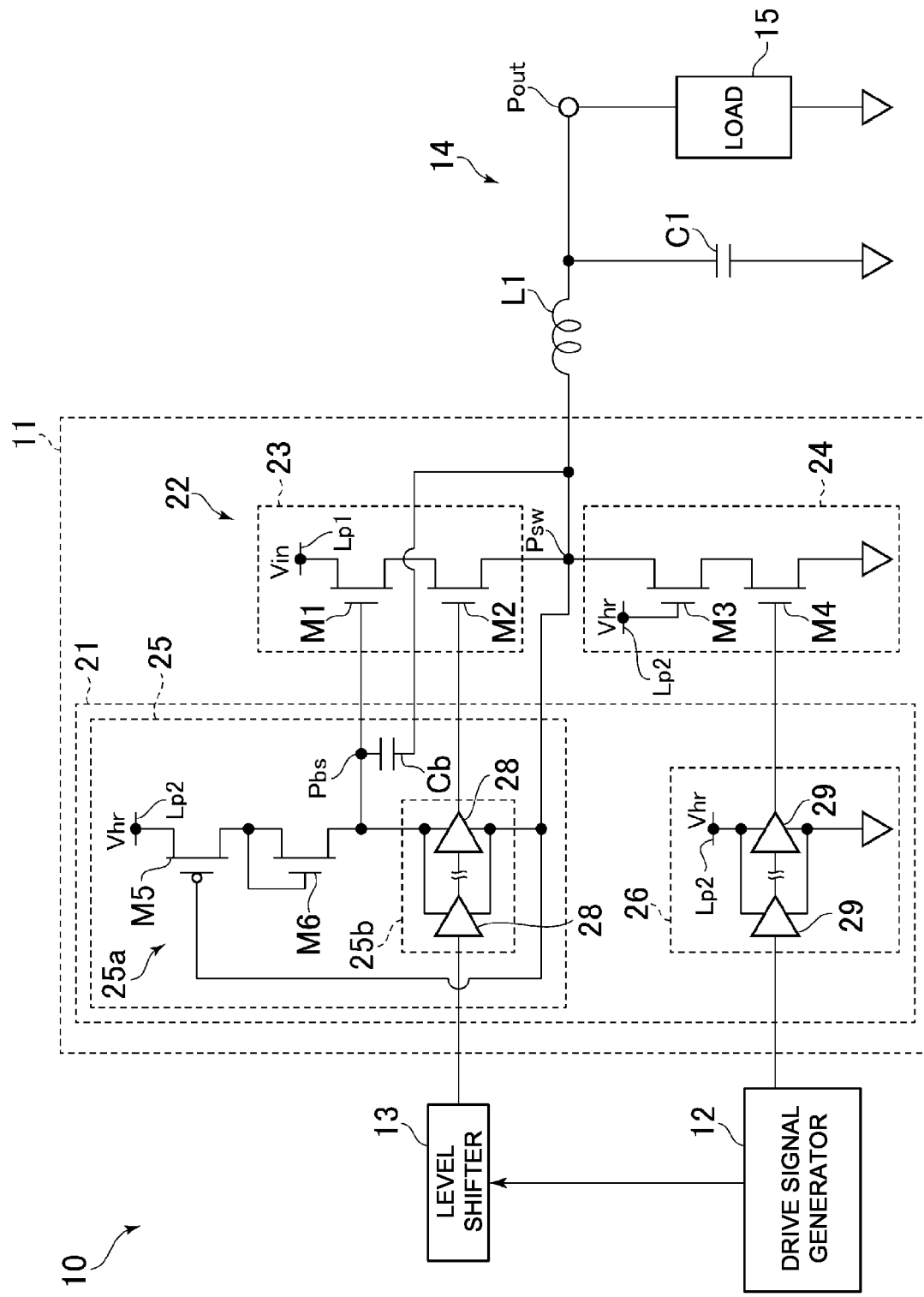
FIG. 1 is a circuit diagram illustrating a circuit configuration of a step-down DC-DC converter embodying the present invention.

In FIG. 1, a step-down DC-DC converter (hereinafter, referred to as "converter") 10 embodying the present invention includes a switching circuit part 11, a drive signal generator 12, a level shifter 13, and a smoothing circuit 14. The converter 10 steps down an input voltage Vin (e.g., 3.3 V), which is supplied from a high voltage source (not illustrated) serving as a conversion source voltage generator, to an output voltage Vout (e.g., 1.2 V) and supplies it to a load 15. Further, the switching circuit part 11 operates when receiving a drive voltage Vhr from a drive power source (not illustrated). The drive voltage Vhr is, for example, 1.65 V. Each of the high voltage source and the drive power source has a low-voltage terminal being grounded to a reference potential of the entire device.

For example, except for a bootstrap capacitor Cb described below, each circuit element configuring the switching circuit part 11 is formed on a single semiconductor substrate together with a circuit of the load 15, and integrated into one chip.

The switching circuit part 11 serving as a switching circuit device has a driving part 21 and a switching element part 22 driven by the driving part 21. The switching element part 22 has a high-side switching element circuit (hereinafter, referred to as "HSW circuit") 23 connected to a high-voltage side of the high voltage source and a low-side switching element circuit (hereinafter, referred to as "LSW circuit") 24 connected to a low-voltage side of the high voltage source, namely a ground side. The HSW circuit 23 and the LSW circuit 24 are connected in series, and a connection point Psw of the HSW circuit 23 and the LSW circuit 24 is connected to the smoothing circuit 14. The connection point Psw is a portion corresponding to or connected to an output terminal of the switching circuit part 11. The driving part 21 includes a high-side drive circuit 25 for driving the HSW circuit 23 and a low-side drive circuit 26 for driving the LSW circuit 24.

The drive signal generator 12 generates drive signals for turning on and off the HSW circuit 23 and the LSW circuit 24. The drive signals include a first drive signal for turning on and off the HSW circuit 23 and a second drive signal for turning on and off the LSW circuit 24. The drive signal generator 12 generates the first and second drive signals so that the HSW circuit 23 and the LSW circuit 24 are alternately turned on. The drive signal generator 12 performs pulse width modulation (PWM) for changing the pulse width of each of the first drive signal and the second drive signal according to the magnitude of the load 15. The level shifter 13 converts the first drive signal into a signal of the reference potential of the high-side drive circuit 25.

The smoothing circuit 14 smoothens the output voltage of the switching circuit part 11, namely, the voltage of the connection point Psw, and outputs it as the output voltage Vout to an output terminal Pout. The smoothing circuit 14 includes a choke coil L1 having one end connected to the connection point Psw and the other end connected to the output terminal Pout and a capacitor C1 having one end connected to the other end of the choke coil L1 and the other end being grounded.

The above-mentioned HSW circuit 23 includes a high-side switching element M1 and a high-side switching element M2. Each of the high-side switching elements M1 and M2 is made of an n-type MOSFET (metal-oxide-semiconductor field-effect transistor). The high-side switching elements M1 and M2 are connected in series between a high-voltage terminal of the high voltage source and the above-mentioned connection point Psw. In this example, a drain terminal of the high-side switching element M1 is connected to a high-voltage line Lp1 connected to the high-voltage terminal of the high voltage source. A source terminal of the high-side switching element M1 and a drain terminal of the high-side switching element M2 are mutually connected. A source terminal of the high-side switching element M2 is connected to the connection point Psw. In the OFF state of the LSW circuit 24, when the HSW circuit 23 is turned on, namely, when the high-side switching elements M1 and M2 are turned on, the high-voltage terminal of the high voltage source is connected to the connection point Psw and the input voltage Vin is output to the smoothing circuit 14. Each of the high-side switching elements M1 and M2 has a gate terminal connected to the high-side drive circuit 25.

On the other hand, the LSW circuit 24 includes a low-side switching element M3 and a low-side switching element M4. Each of the low-side switching elements M3 and M4 is made of an n-type MOSFET. The low-side switching elements M3 and M4 are connected in series between the above-mentioned connection point Psw and the low-voltage terminal of the high voltage source. That is, a drain terminal of the low-side switching element M3 is connected to the connection point Psw. A source terminal of the low-side switching element M3 and a drain terminal of the low-side switching element M4 are mutually connected. A source terminal of the low-side switching element M4 is grounded. In the OFF state of the HSW circuit 23, when the LSW circuit 24 is turned on, namely, when the low-side switching elements M3 and M4 are turned on, the connection point Psw is grounded and the voltage of 0 V is output to the smoothing circuit 14. A gate terminal of the low-side switching element M3 is connected to a high-voltage terminal of the drive power source via a drive power source line Lp2. A gate terminal of the low-side switching element M4 is connected to the low-side drive circuit 26.

In this example, the high-side switching element M1 is a first high-side switching element, and the high-side switching element M2 is a second high-side switching element. Further, the low-side switching element M3 is a first low-side switching element, and the low-side switching element M4 is a second low-side switching element.

In this example, although each of the HSW circuit 23 and the LSW circuit 24 has a configuration in which two switching elements are connected in series, it is also possible to configure each circuit with a single switching element. In this case, the HSW circuit 23 may include only the high-side switching element M2, and the LSW circuit 24 may include only the low-side switching element M4. Further, each of the HSW circuit 23 and the LSW circuit 24 may be constituted by three or more switching elements. In this case, for example, in the HSW circuit 23, a plurality of high-side switching elements whose gate terminal is connected to a first terminal of the bootstrap capacitor Cb, as a gate terminal of the high-side switching element M1 described in detail below, can be connected in series between the high-side switching element M2 and the high-voltage terminal of the high voltage source. In the LSW circuit 24, a plurality of low-side switching elements whose gate terminal is connected like the low-side switching element M3 can be connected in series between the connection point Psw and the low-side switching element M4. From the viewpoint of reducing the magnitude of drain-source voltage of each switching element in the OFF state of the switching element, it is desired to configure each of the HSW circuit 23 and the LSW circuit 24 by two or more switching elements connected in series so that the input voltage Vin can be distributed to each switching element. Distributing the input voltage Vin to the plurality of switching elements can cope with a higher input voltage.

The high-side drive circuit 25 for turning on and off the HSW circuit 23 includes a bootstrap circuit 25a and a circuit body part 25b. The bootstrap circuit 25a includes a switching circuit having a switching element M5 of a p-type MOSFET and a switching element M6 of an n-type MOSFET, and includes the bootstrap capacitor Cb. The circuit body part 25b includes a plurality of buffers 28 connected in series. The first drive signal is input from the level shifter 13, and a gate voltage Vg is applied to the high-side switching element M2 according to the input first drive signal.

The switching element M5 of the bootstrap circuit 25a has a source terminal connected to the high-voltage terminal of the drive power source via the drive power source line Lp2 and a gate terminal connected to the connection point Psw. Accordingly, when the LSW circuit 24 is turned on, namely, when the low-side switching elements M3 and M4 are turned on, a ground voltage is applied to the gate terminal of the switching element M5, and the switching element M5 is turned on. The switching element M6 has a drain terminal and a gate terminal, which are connected to the drain terminal of the switching element M5. When the switching element M5 is turned on, the gate voltage is applied and the switching element M6 is turned on.

The bootstrap capacitor Cb has one end connected to the gate terminal of the high-side switching element M1 and the other end connected to the connection point Psw. A source terminal of the switching element M6 is connected to a connection point Pbs of the first terminal of the bootstrap capacitor Cb and the gate terminal of the high-side switching element M1. Accordingly, while the LSW circuit 24 is ON, the first terminal of the bootstrap capacitor Cb is connected to the high-voltage terminal of the drive power source via the switching elements M5 and M6 being ON, and the second terminal is grounded via the LSW circuit 24. Therefore, the bootstrap capacitor Cb is charged until the voltage between the terminals reaches the drive voltage Vhr.

The switching circuit of the bootstrap circuit 25a may include, for example, only the switching element M5. However, adopting the configuration in which the switching elements M5 and M6 are connected in series as mentioned above is desired because the drive voltage Vhr can be distributed to each switching element. The switching circuit may include three or more switching elements connected in series.

Each buffer 28 of the circuit body part 25b has a positive power supply terminal connected to the connection point Pbs and a negative power supply terminal connected to the connection point Psw. Accordingly, when turning on the HSW circuit 23 in response to the first drive signal, the circuit body part 25b operates under power supply from the charged bootstrap capacitor Cb and applies a voltage Vbs of the connection point Pbs by the charging voltage as the gate voltage Vg of the high-side switching element M2, thereby turning on the high-side switching element M2. When the voltage Vbs of the connection point Pbs under the charging voltage of the bootstrap capacitor Cb is applied as the gate voltage Vg, upon turning of the high-side switching element M2, the high-side switching element M1 is turned on. When the high-side switching elements M1 and M2 are turned on, the connection point Psw brought into a floating state due to the turning-off of the LSW circuit 24 rises to the input voltage Vin of the high-voltage terminal of the high voltage source. Since the bootstrap capacitor Cb is connected to the connection point Pbs at one end and is connected to the connection point Psw at the other end, the voltage Vbs of the connection point Pbs becomes higher by a voltage Vsw of the connection point Psw. In order to completely turn on the high-side switching elements M1 and M2, the gate voltage Vg higher than the input voltage Vin serving as the drain voltage thereof is necessary. However, as mentioned above, it is possible to completely turn on the high-side switching elements M1 and M2 with the gate voltage Vg (=Vbs) higher than the input voltage Vin by the charging voltage (=the drive voltage Vhr) of the bootstrap capacitor Cb.

The low-side drive circuit 26 for turning on and off the LSW circuit 24 includes a plurality of buffers 29 connected in series, like the circuit body part 25b. When turning on the LSW circuit 24 according to the second drive signal, the low-side drive circuit 26 applies the drive voltage Vhr of the drive power source as the gate voltage Vg to the low-side switching element M4, thereby turning on the low-side switching element M4. As mentioned above, since the low-side switching element M3 is connected to the high-voltage terminal of the drive power source at the gate terminal and is connected to the low-side switching element M4 at the source terminal, the low-side switching element M3 is turned on in conjunction with the turning-on of the low-side switching element M4.

As mentioned above, the n-type MOSFETs that are smaller in ON resistance are used as the high-side switching elements M1 and M2 constituting the HSW circuit 23. This makes it possible to reduce the size of transistors compared to the case of using p-type MOSFETs allowing drain current (IDS) of the same magnitude to flow. As a result, it is advantageous for downsizing the chip. In addition, compared to the case of using the p-type MOSFET, the conduction loss is small and it is possible to achieve high efficiency, that is, power saving.

Further, as mentioned above, with respect to the switching element part 22 including the HSW circuit 23 and the LSW circuit 24, it is unnecessary to provide an n-type well configuring the p-type MOSFET when all the switching elements are formed by n-type MOSFETs. Further, it is unnecessary to provide an isolation region for separating the n-type well from a p-type well configuring the n-type MOSFET on the semiconductor substrate. Therefore, not only the semiconductor substrate size of the switching element part 22 can be reduced but also the number of manufacturing processes can be reduced.

When the high-side switching elements M1 and M2 are ON, that is, when the low-side switching elements M3 and M4 are OFF, the potential of the connection point Psw where the source terminals of the high-side switching elements M1 and M2 are connected is brought into a state where it is floated from the ground potential by a threshold voltage of the low-side switching elements M3 and M4. Therefore, in the case of configuring the high-side switching elements M1 and M2 by n-type MOSFETs each having a general structure, the apparent threshold voltage becomes higher due to substrate bias (back bias) effect brought by the floating. Therefore, when attempting to obtain a desired drain current (IDS), the size of transistors becomes larger.

Therefore, as the high-side switching elements M1 and M2 to be used in the HSW circuit 23, it is desired to use MOSFETs each having a structure not causing any substrate bias effect. The MOSFET having a structure not causing the substrate bias effect is, for example, a vertical BC (Body Channel)-MOSFET.

Figure 2:
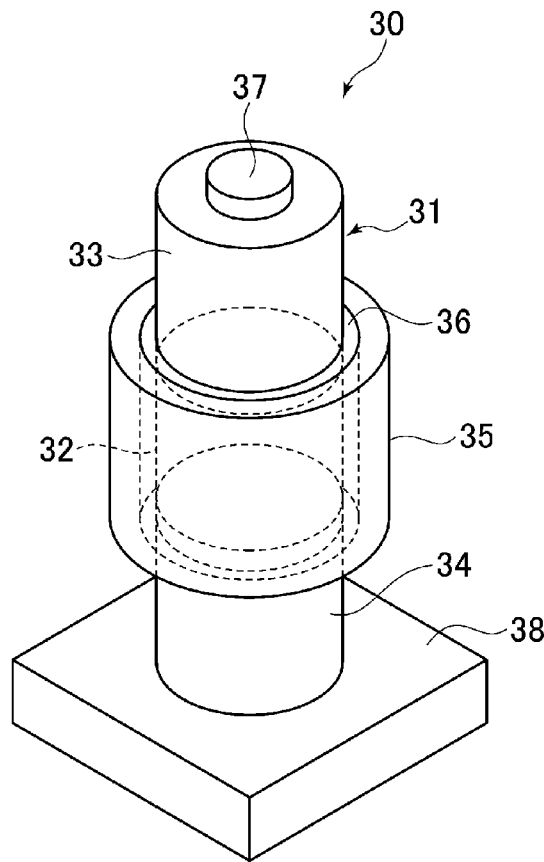
FIG. 2 is a perspective view illustrating an appearance of a vertical BC-MOSFET.

An exemplary n-type vertical BC-MOSFET 30 illustrated in FIG. 2 has a structure including a semiconductor pillar 31, a gate electrode 35 provided in such a way as to surround a central portion of the semiconductor pillar 31, and a gate oxide film 36 serving as a gate insulation film provided between the gate electrode 35 and the semiconductor pillar 31. The n-type vertical BC-MOSFET 30 further includes a p-type semiconductor region 32 serving as a channel provided at the central portion of the semiconductor pillar 31, a drain region 33 provided at one end thereof, and a source region 34 provided at the other end thereof. The vertical BC-MOSFET 30 is, for example, formed on a silicon substrate 38. The semiconductor pillar 31 is, for example, made of silicon. The drain region 33 and the source region 34 are doped with an end of the semiconductor pillar 31 so that each region becomes n-type. In this vertical BC-MOSFET 30, the rise of the threshold voltage due to a back-bias effect can be ignored because the p-type semiconductor region 32 is completely depleted. The vertical BC-MOSFET 30 has a drain electrode 37. Further, in the vertical BC-MOSFET 30 illustrated in FIG. 2, the semiconductor pillar 31 has an axis extending in a direction perpendicular to the surface of the silicon substrate 38. However, the semiconductor pillar 31 may be formed so that the axis extends in a direction horizontal to the surface of the silicon substrate 38. Further, a plurality of vertical BC-MOSFETs may be stacked in the axial direction of the semiconductor pillar 31.

In the above-mentioned vertical BC-MOSFET, it is unnecessary to form a well region in the semiconductor substrate, and further it is unnecessary to form a well contact (electrode) electrically connected the well region. Therefore, the semiconductor circuit substrate can be downsized and the manufacturing processes can be simplified.

Figure 3:
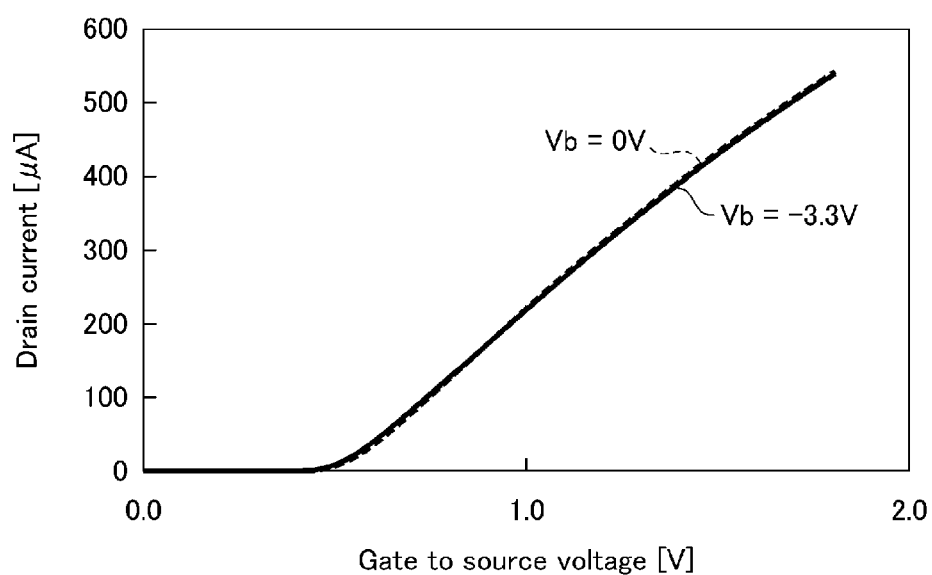
FIG. 3 is a graph illustrating changes in VGS-IDS characteristics with respect to substrate bias voltage of an n-type vertical BC-MOSFET.
Figure 4:
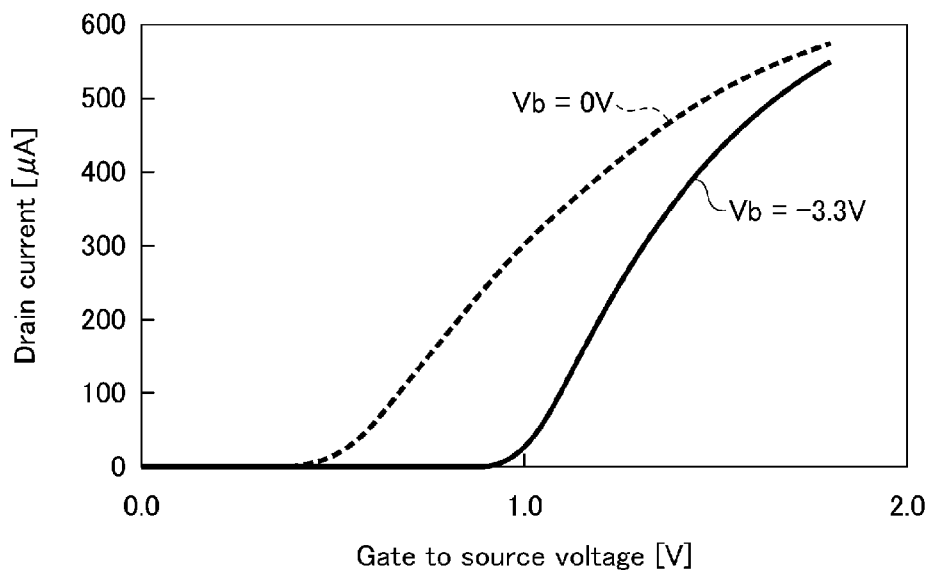
FIG. 4 is a graph illustrating changes in VGS-IDS characteristics with respect to substrate bias voltage of an n-type planer MOSFET.

FIG. 3 is a graph illustrating simulation results of the influence of the substrate bias effect on the gate-source voltage and drain current characteristics (VGS-IDS characteristics) of the n-type vertical BC-MOSFET 30 having the structure illustrated in FIG. 2. In this simulation, it is assumed that the substrate bias voltage applied to the silicon substrate 38 is 0 V and −3.3 V. Further, regarding dimensions of the vertical BC-MOSFET 30 used in the simulation, the peripheral length of the semiconductor pillar 31 is set to 5 μm as the length corresponding to a gate width W, and the height of the gate electrode 35 (the length of the semiconductor pillar 31 in the axial direction) is set to 0.18 μm as the length corresponding to a gate length (L). As a result, even if the substrate bias voltage is changed, it is understood that the VGS-IDS characteristics do not change at all and no substrate bias effect occurs in this structure. FIG. 4 illustrates simulation results of the influence of the substrate bias effect on the VGS-IDS characteristics of an n-type planer MOSFET. As illustrated in FIG. 4, it is understood that in the planer MOSFET the threshold voltage rises when the substrate bias voltage changes from 0 V to −3.3 V and the substrate bias effect occurs. The planer MOSFET has a gate width (W) of 5 μm and a gate length (L) of 0.18 μm.

Figure 5:
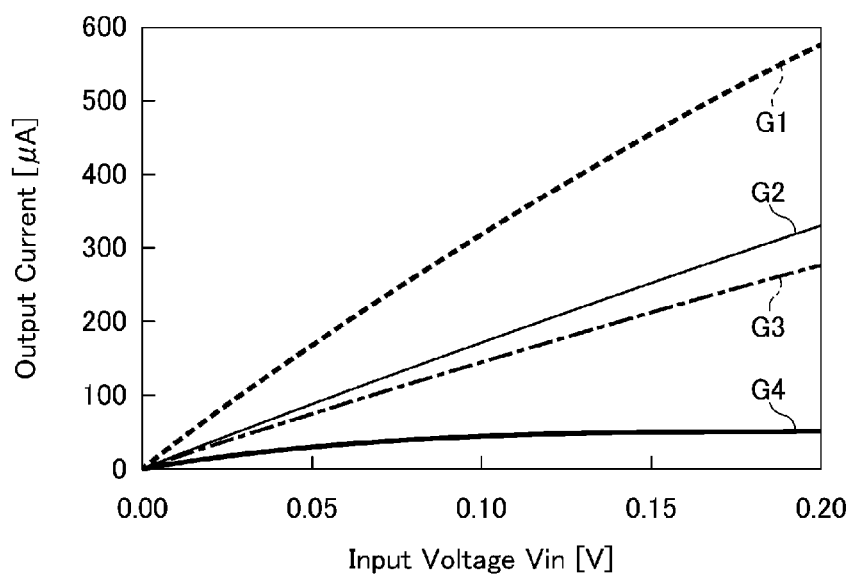
FIG. 5 is a graph illustrating differences in performances between n-type and p-type MOSFETs and between vertical and planer MOSFETs.

FIG. 5 illustrates simulation results of changes in the output current output from the HSW circuit 23 with respect to the input voltage Vin, in a case of using n-type vertical BC-MOSFETs, in a case of using p-type vertical BC-MOSFETs, in a case of using n-type planer MOSFETs, and in a case of using p-type planer MOSFETs, as the high-side switching elements M1 and M2 of the HSW circuit 23. In FIG. 5, a curve G1 indicates a result of using the n-type vertical BC-MOSFETs. Further, a curve G2 indicates a result of using the p-type planer MOSFETs, a curve G3 indicates a result of using the p-type vertical BC-MOSFETs, and a curve G4 indicates a result of using the n-type planer MOSFETs.

In the above simulation, it is assumed that the source terminal of the high-side switching element M2 is grounded and the applied substrate bias voltage is −3.3 V in the case of using the n-type vertical BC-MOSFETs and in the case of using the n-type planer MOSFETs. Regarding dimensions of the vertical BC-MOSFET, the peripheral length of the semiconductor pillar 31 is set to 5 μm as the length corresponding to the gate width W and the height of the gate electrode 35 is set to 0.18 μm as the length corresponding to the gate length (L). Further, regarding dimensions of the planer MOSFET, the gate width (W) is set to 5 μm and the gate length (L) is set to 0.18 μm.

From the simulation result illustrated in FIG. 5, it is understood that the obtained output current is larger when using the n-type vertical BC-MOSFETs as the high-side switching elements M1 and M2 than when using other structures. For example, when the input voltage is 0.10 V, the output current when using the n-type vertical BC-MOSFETs as the high-side switching elements M1 and M2 is larger by 94% than the output current when using the p-type planer MOSFETs.

Figure 6:
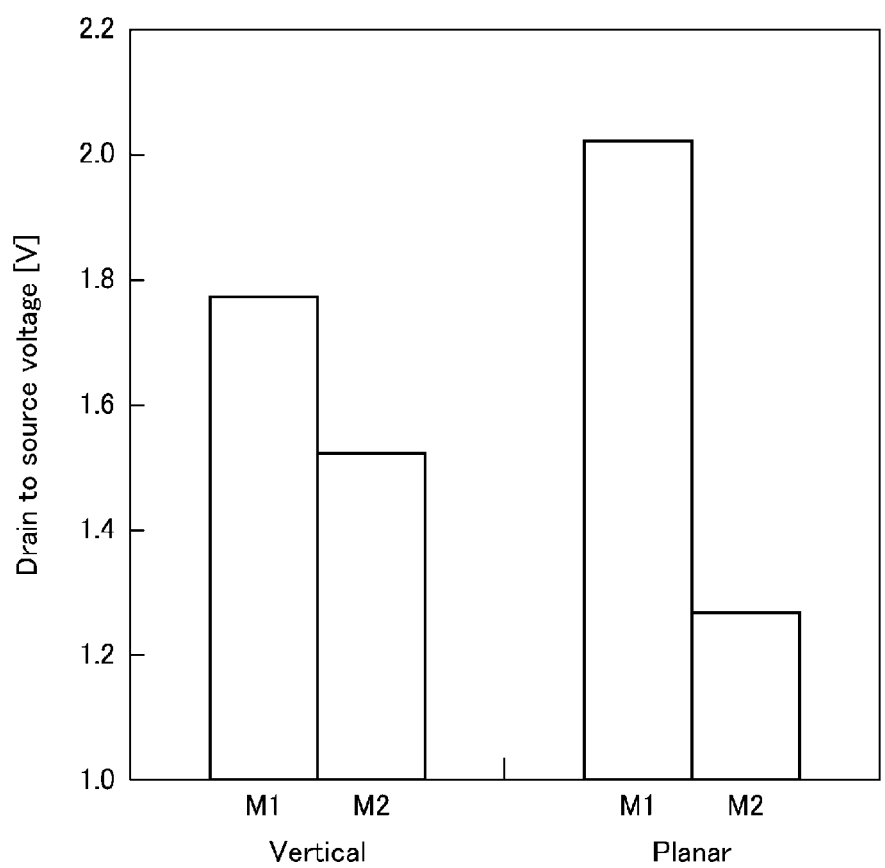
FIG. 6 is a graph illustrating a distribution state of input voltage in an OFF state of high-side switching elements connected in series.

FIG. 6 illustrates simulation results of a distribution state of the voltage distributed to the high-side switching elements M1 and M2 with the input voltage of OFF state (drain-source voltage), in a case of using the n-type vertical BC-MOSFETs (Vertical) and in the case of using the n-type planer MOSFETs (Planar), as the high-side switching elements M1 and M2. From this result, it is understood that when using the vertical BC-MOSFETs as the high-side switching elements M1 and M2 the voltage distributed to the high-side switching elements M1 and M2 of OFF state is close to an equal distribution state. This is considered that since no substrate bias effect is obtained in the vertical BC-MOSFET and as a result the rise of the threshold voltage of the high-side switching element M1 can be suppressed.

According to the simulation result, when using the vertical BC-MOSFET as the high-side switching element M1, the drain-source voltage is smaller by 0.25 V, compared to the case where the planer MOSFET is used. Accordingly, it is possible to cope with a larger input voltage. In the simulation, the source terminal and the gate terminal of the high-side switching element M2 were grounded, the input voltage Vin applied to the drain terminal of the high-side switching element M1 was 3.3 V, and the gate potential of the high-side switching element M1 was 1.65 V.

Further, as the MOSFET having a structure not causing the substrate bias effect, an n-type planer MOSFET having a triple well structure may be used. The triple well structure of the n-type MOSFET includes an n-type well formed on a p-type substrate, a p-type well formed in the n-type well, an n-type drain region and a source region formed in the p-type well, and a gate electrode formed on a channel region between the drain region and the source region via a gate insulation film. In this case, by connecting the source region and the n-type well, the rise of threshold voltage due to the substrate bias effect can be suppressed.

In addition to the high-side switching elements M1 and M2, it is possible to use vertical BC-MOSFETs or n-type MOSFETs having the triple well structure for the low-side switching elements M3 and M4 in the LSW circuit 24.

Figure 7:
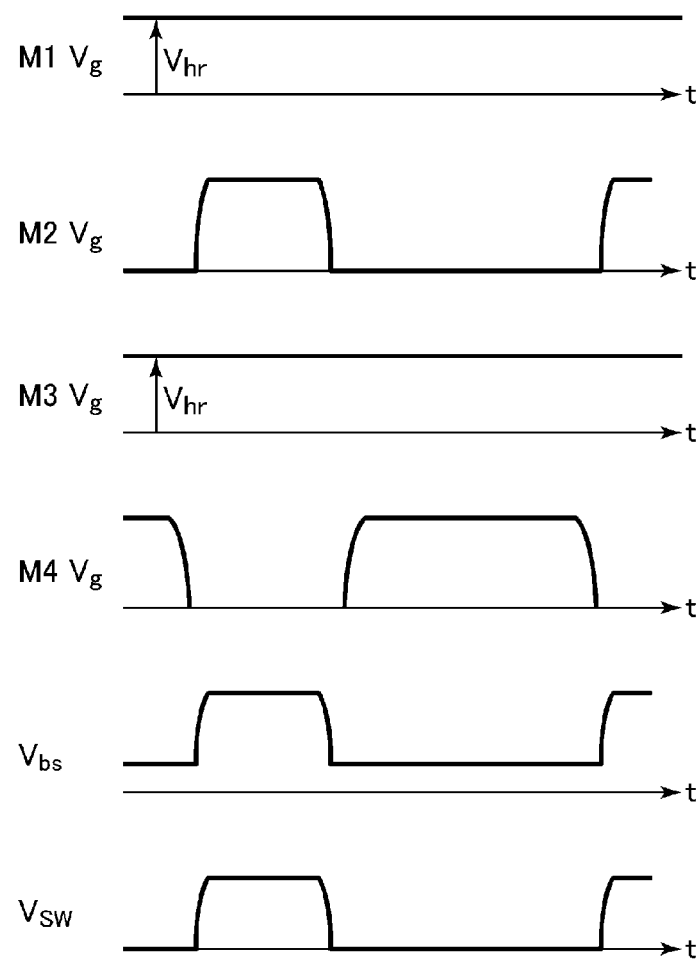
FIG. 7 is a timing chart illustrating potential and voltage changes at respective parts of a switching circuit part.

Hereinafter, an exemplary operation of the above-mentioned configuration will be described with reference to FIG. 7. FIG. 7 illustrates the gate voltage Vg of the high-side switching element M1, the gate voltage Vg of the high-side switching element M2, the gate voltage Vg of the low-side switching element M3, the gate voltage Vg of the low-side switching element M4, the potential Vbs of the connection point Pbs, and the potential Vsw of the connection point Psw. The gate voltage Vg of the high-side switching element M1 is a potential difference from the connection point Psw, and the gate voltage Vg of the low-side switching element M3 is a potential difference from the ground potential.

First, according to the second drive signal, the low-side drive circuit 26 applies the gate voltage Vg (=Vhr) to the low-side switching element M4, thereby turning on the low-side switching element M4. Upon turning-on of the low-side switching element M4, the gate voltage Vg (=Vhr) is applied to the low-side switching element M3, thereby turning on the low-side switching element M3. When the low-side switching elements M3 and M4 are turned on in this manner, the connection point Psw is grounded via these elements. As a result, 0 V is output to the smoothing circuit 14. While the low-side switching elements M3 and M4 are ON, the high-side switching elements M1 and M2 are OFF.

On the other hand, when the low-side switching elements M3 and M4 are turned on as mentioned above, the second terminal of the bootstrap capacitor Cb connected to the connection point Psw is grounded via the low-side switching elements M3 and M4. In addition, in response to the turning-on of the low-side switching elements M3 and M4, the switching elements M5 and M6 are turned on sequentially and the first terminal of the bootstrap capacitor Cb close to the connection point Pbs is connected to the high-voltage terminal of the drive power source. Accordingly, the bootstrap capacitor Cb is charged by the current supplied from the drive power source, and the potential at the first terminal rises to the drive voltage Vhr with respect to the second terminal close to the connection point Psw. That is, the voltage between the terminals of the bootstrap capacitor Cb becomes the drive voltage Vhr.

When the low-side drive circuit 26 stops applying the gate voltage Vg to the low-side switching element M4 according to the second drive signal after the elapse of a predetermined time, the low-side switching element M4 is turned off and the low-side switching element M3 is turned off correspondingly. The connection point Psw is disconnected from the ground and brought into the floating state. Further, when the low-side switching elements M3 and M4 are turned off, the switching elements M5 and M6 are sequentially turned off and the connection point Pbs is disconnected from the high-voltage terminal of the drive power source. Accordingly, the connection point Pbs is brought into a state where the drive voltage Vhr, which is the voltage between the terminals of the bootstrap capacitor Cb, is given with the connection point Psw as the reference potential.

The drive voltage Vhr between the connection point Pbs and the connection point Psw due to the voltage between the terminals of the bootstrap capacitor Cb is given to the circuit body part 25b. Then, at the timing of turning on the HSW circuit 23 according to the first drive signal, the circuit body part 25b applies the gate voltage Vg to the high-side switching element M2. Although the voltage applied between the gate and source terminals of the high-side switching element M2 is the voltage between the terminals (=Vhr) of the bootstrap capacitor Cb, the gate voltage Vg applied to the gate terminal with reference to the ground potential is a voltage obtained by adding the voltage Vsw of the connection point Psw serving as the input voltage Vin to the voltage between the terminals (=Vhr) of the bootstrap capacitor Cb. Therefore, the gate voltage Vg higher than the drain voltage is applied and the high-side switching element M2 is turned on.

Although the gate voltage Vg applied to the gate terminal with reference to the potential of the connection point Psw applied to the high-side switching element M1 is the voltage between the terminals (=Vhr) of the bootstrap capacitor Cb, when the high-side switching element M2 is turned on, the gate voltage with reference to the ground potential takes a value obtained by adding the voltage Vsw of the connection point Psw serving as the input voltage Vin to the voltage between the terminals (=Vhr), similar to the high-side switching element M2. Accordingly, the gate voltage higher than the drain voltage is applied and the high-side switching element M1 is turned on.

When the high-side switching elements M1 and M2 are turned on in this manner, the connection point Psw is connected to the high-voltage terminal of the high voltage source via these elements. Accordingly, the input voltage Vin is output to the smoothing circuit 14.

When the high-side drive circuit 25 stops applying the gate voltage Vg to the high-side switching element M2 according to the first drive signal after the elapse of a predetermined time, the high-side switching element M2 is turned off and the high-side switching element M1 is turned off correspondingly.

After the high-side switching elements M1 and M2 are turned off, the low-side switching elements M3 and M4 are turned on in the same manner as described above. While the low-side switching elements M3 and M4 are ON, the bootstrap capacitor Cb is charged. When the low-side switching elements M3 and M4 are turned off after the elapse of a predetermined time, the high-side switching elements M1 and M2 are turned on. In the same manner as described above, the high-side switching elements M1 and M2 are turned on by the charging voltage of the bootstrap capacitor Cb.

As described above, the ON state of the high-side switching elements M1 and M2 and the ON state of the low-side switching elements M3 and M4 are alternately repeated. Correspondingly, the voltage output from the connection point Psw changes between the input voltage Vin and 0 V. Then, the smoothing circuit 14 smoothens the changing voltage of the connection point Psw, whereby the output voltage Vout stepped down from the input voltage Vin is supplied from the output terminal Pout to the load 15.

Figure 8:
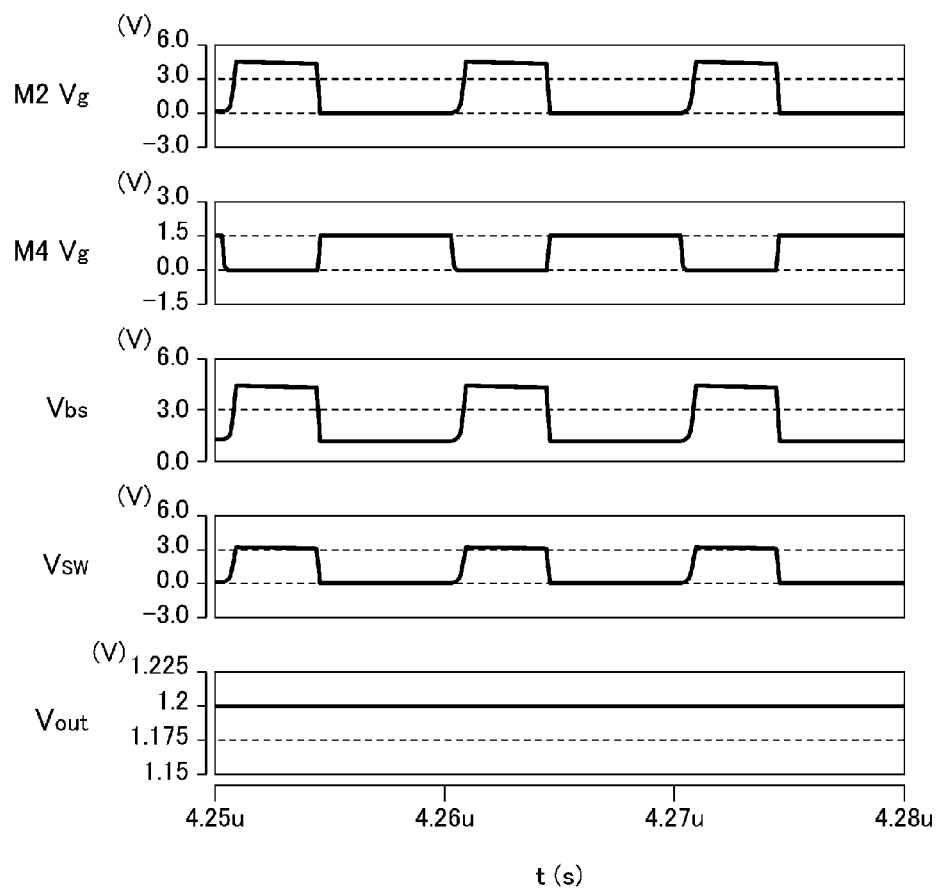
FIG. 8 is a graph illustrating simulation results of voltage changes at respective parts of the switching circuit part.

FIG. 8 illustrates the gate voltage Vg of the high-side switching element M2, the gate voltage Vg of the low-side switching element M4, the potential Vbs of the connection point Pbs, the potential Vsw of the connection point Psw, and the output voltage Vout of the output terminal Pout, which were obtained in a simulation in which the switching frequency of the switching circuit part 11 is 100 MHz. From this result, it is understood that the switching circuit part 11 operates normally even when the switching frequency is 100 MHz. The horizontal axis of the graph illustrated in FIG. 8 represents time.

Figure 9:
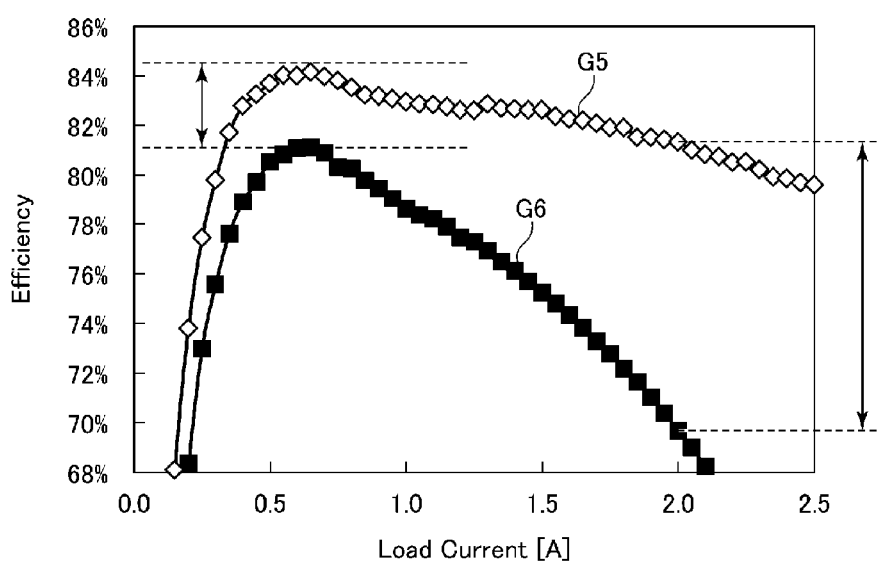
FIG. 9 is a graph illustrating changes in efficiency with respect to changes in load current.

FIG. 9 illustrates simulation results of changes in efficiency of the converter 10 with respect to changes in load current. The horizontal axis of the graph illustrated in FIG. 9 represents the load current (A), and the vertical axis represents the efficiency (%). A curve G5 indicates the case of using n-type vertical BC-MOSFETs as the high-side switching elements M1 and M2, and a curve G6 indicates the case of using p-type vertical BC-MOSFETs as the high-side switching elements M1 and M2. The efficiency is expressed as "Efficiency=[P/(P(Vin)+P(Vhr))]×100%", in which P(Vin) represents electric power supplied to the converter 10 with respect to the input voltage Vin, P(Vhr) represents electric power supplied to the converter 10 with respect to the drive voltage Vhr, and P represents output electric power.

From the above-mentioned result, it is understood that the efficiency is higher when using n-type vertical BC-MOSFETs as the high-side switching elements M1 and M2, compared to the case of using p-type vertical BC-MOSFETs. When compared in peak efficiency, the difference between using the n-type vertical BC-MOSFETs and using the p-type vertical BC-MOSFETs is 3%. Further, in the case of using the n-type vertical BC-MOSFETs, the efficiency is high even under heavy load, and under the condition that the load current is 2 (A), the efficiency difference from the case of using the p-type vertical BC-MOSFETs is 11%.

Figure 10:
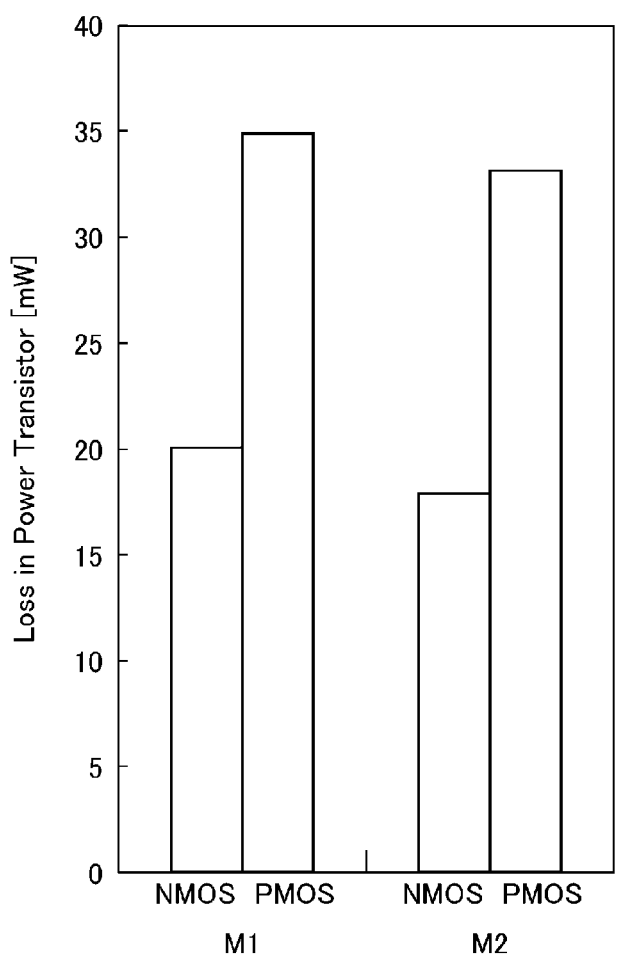
FIG. 10 is a graph illustrating the loss in each high-side switching element.

Further, as understood from FIG. 10 illustrating simulation results of the internal loss of the high-side switching elements M1 and M2, the internal loss in the case of using the n-type vertical BC-MOSFETs as the high-side switching elements M1 and M2 is considerably smaller than that in the case of using the p-type vertical BC-MOSFETs. Regarding the high-side switching element M1, the internal loss in the case of using the n-type vertical BC-MOSFET is 43% lower than that in the case of using the p-type vertical BC-MOSFETs. Regarding the high-side switching element M2, the internal loss in the case of using the n-type vertical BC-MOSFET is 46% lower than that in the case of using the p-type vertical BC-MOSFET.

Figure 11:
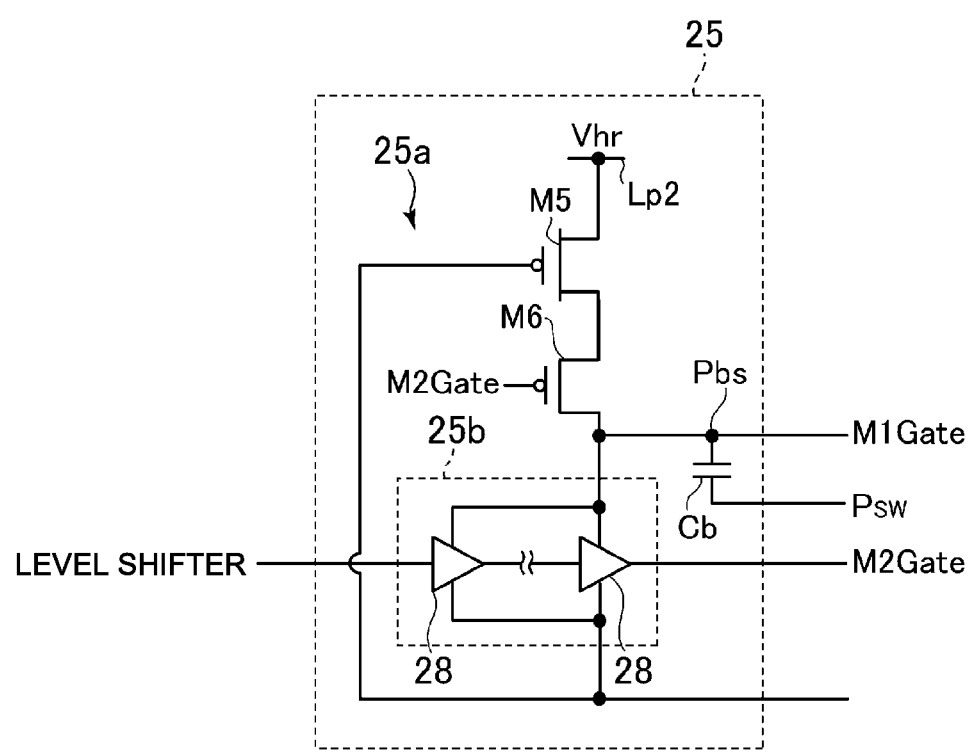
FIG. 11 is a circuit diagram illustrating an example of a bootstrap circuit including switching elements with p-type MOSFETs.

Although the n-type MOSFET is used as the switching element M6 of the bootstrap circuit 25a as mentioned above, it may be modified as illustrated in FIG. 11 in which a p-type MOSFET is used as the switching element M6. According to the example illustrated in FIG. 11, the switching element M6 has a source terminal connected to the drain terminal of the switching element M5 and a drain terminal connected to the connection point Pbs. Further, the switching element M6 has a gate terminal connected to the gate terminal of the high-side switching element M2.

Second Embodiment

A second embodiment has a configuration in that the first and second high-side switching elements connected in series in the HSW circuit are multi-pillar type vertical BC-MOSFETs. Except for the first and second high-side switching elements including the multi-pillar type vertical BC-MOSFETs, the second embodiment is like the first embodiment in the remaining configuration such as the circuit configuration of the converter and therefore substantially the same components are denoted by the same reference numerals and a detailed description thereof will be omitted.

Figure 12:
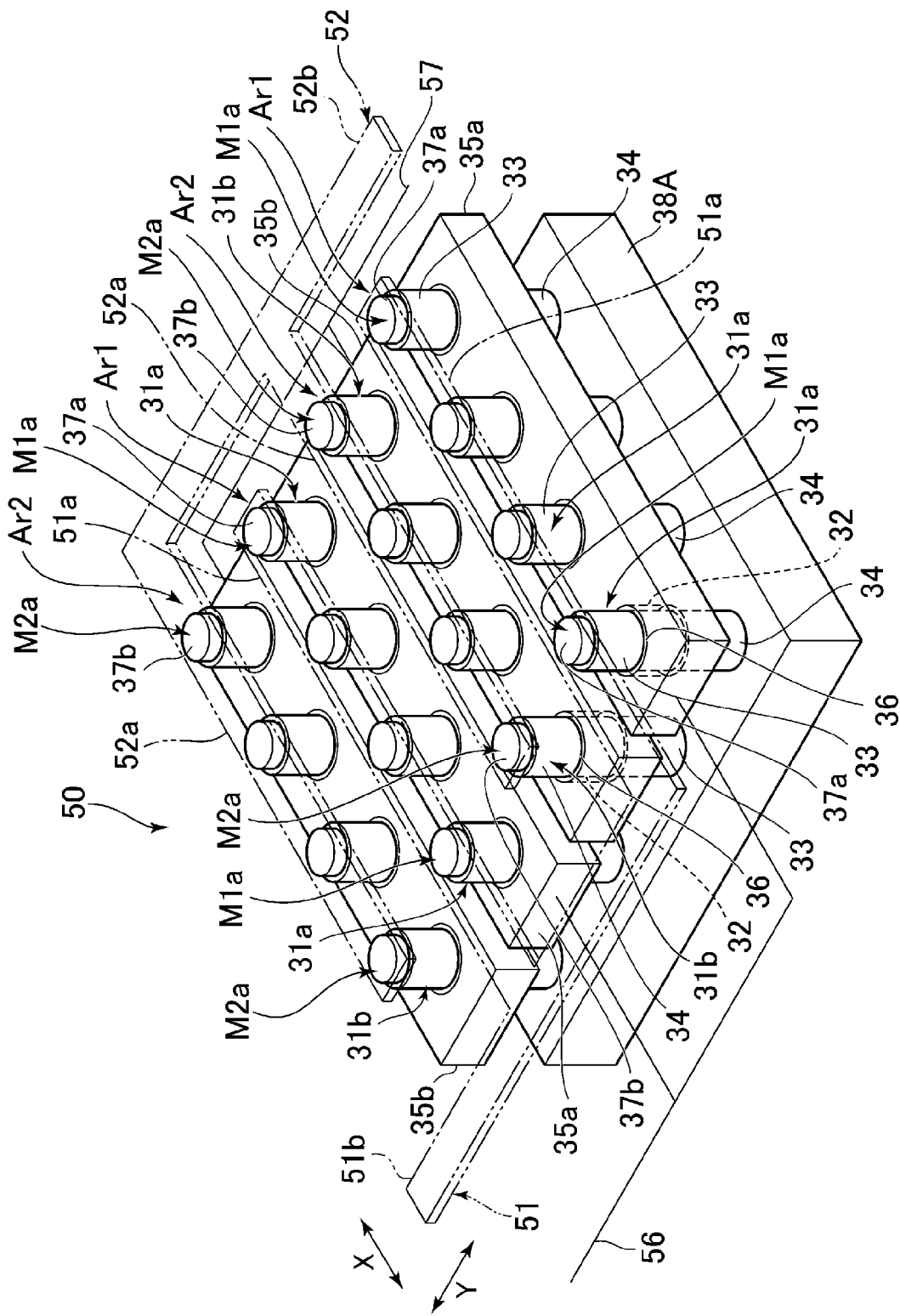
FIG. 12 is a perspective view illustrating an element unit according to a second embodiment.

In this example, as illustrated in FIG. 12, an element unit 50 is employed as a series circuit of the high-side switching elements M1 and M2 (refer to FIG. 1). The element unit 50 roughly includes a silicon substrate 38A, a plurality of first transistor arrays Ar1 serving as the high-side switching element M1, a plurality of second transistor arrays Ar2 serving as the high-side switching element M2, a drain wiring 51, and a source wiring 52. As described in detail below, the first transistor array Ar1 includes the plurality of transistors M1a, the second transistor array Ar2 includes the plurality of transistors M2a, and each of the transistors M1a and M2a is a vertical BC-MOSFET.

An impurity diffusion layer is formed on one surface of the silicon substrate 38A. Through the impurity diffusion layer, the source region 34 of the transistor M1a is electrically connected to the drain region 33 of the transistor M2a. Since the transistors M1a and M2a are n-type MOSFETs, the impurity diffusion layer is doped with n-type impurities. The silicon substrate 38A may be an n-type semiconductor substrate. Further, the silicon substrate 38A may have a configuration in which the impurity diffusion layer is formed on a part of a substrate on which another circuit is formed.

The first transistor array Ar1 is formed by integrating the plurality of (four in this example) transistors M1a, and includes a plurality of semiconductor pillars 31a serving as first semiconductor pillars aligned in a line at predetermined intervals in the X direction, a first array gate electrode 35a commonly provided for respective semiconductor pillars 31a and serving as a first gate array electrode surrounding a central portion of each semiconductor pillar 31a, and a gate oxide film 36 serving as a gate insulation film provided between the semiconductor pillar 31a and the first array gate electrode 35a. One transistor M1a includes one semiconductor pillar 31a, and the gate oxide film 36 and the first array gate electrode 35a provided around the central portion of the semiconductor pillar 31a. The first transistor array Ar1 includes the plurality of transistors M1a having a common gate electrode being the first array gate electrode 35a.

The configuration of the above-mentioned transistor M1a is basically identical to that of the vertical BC-MOSFET 30 (refer to FIG. 2) described in the first embodiment. That is, the semiconductor pillar 31a of the transistor M1a has a structure in which a p-type semiconductor region 32 serving as a channel is provided at the central portion thereof, an n-type drain region 33 is provided at one end thereof, and an n-type the source region 34 is provided at the other end. The semiconductor pillar 31a is provided in a stand-up posture on one surface of the silicon substrate 38A, in a state where the other end face, namely, the source region 34, is directly connected to one surface of the silicon substrate 38A. A contact 37a serving as a drain electrode is provided on an upper face (end face on one end) of the semiconductor pillar 31a.

The second transistor array Ar2 is formed by integrating the plurality of (four in this example) transistors M2a, and includes a plurality of semiconductor pillar 31b serving as second semiconductor pillars aligned in a line at predetermined intervals in the X direction, a second array gate electrode 35b commonly provided for respective semiconductor pillars 31b and serving as a second gate array electrode surrounding a central portion of each semiconductor pillar 31b, and a gate oxide film 36 provided between the semiconductor pillar 31b and the second array gate electrode 35b. One transistor M2a includes one semiconductor pillar 31b, and the gate oxide film 36 and the second array gate electrode 35b provided around the central portion of the semiconductor pillar 31b. The second transistor array Ar2 includes the plurality of transistors M2a having a common gate electrode being the second array gate electrode 35b.

The transistor M2a is like the vertical BC-MOSFET 30. The semiconductor pillar 31b has a p-type semiconductor region 32 provided at a central portion thereof, an n-type drain region 33 provided at one end thereof, and an n-type source region 34 provided at the other end. The semiconductor pillar 31b of the transistor M2a is provided in a stand-up posture on one surface of the silicon substrate 38A, in a state where one end face, namely, the drain region 33 is directly connected to one surface of the silicon substrate 38A. A contact 37b serving as a source electrode is provided on an upper face (end face on the other end) of the semiconductor pillar 31b. The height from the surface of the silicon substrate 38A to upper ends of respective semiconductor pillars 31a and 31b is set to be the same.

The first transistor array Ar1 and the second transistor array Ar2 having the above-mentioned configurations extend in the X direction respectively. The first transistor array Ar1 and the second transistor array Ar2 are alternately arranged at predetermined intervals in the Y direction orthogonal to the X direction. In this example, two first transistor arrays Ar1 and two second transistor arrays Ar2 are provided. Further, four transistors M1a or M2a are provided in one first transistor array Ar1 or one second transistor array Ar2. Accordingly, in the element unit 50, the transistors M1a and M2a are provided in a 4×4 matrix pattern. Both the X direction and the Y direction are directions parallel to the surface of the silicon substrate 38. Further, in this example, the X direction is a first direction and the Y direction is a second direction.

The first array gate electrode 35a and the second array gate electrode 35b extend in the X direction respectively. A first gate connection part 56 electrically connects the first array gate electrodes 35a to each other at one end in the X direction. A second gate connection part 57 electrically connects the second array gate electrodes 35b to each other at the other end in the X direction. For example, each first array gate electrode 35a is integrally formed with the first gate connection part 56, thereby forming a comb-like unit gate electrode. Similarly, each second array gate electrode 35b is integrally formed with the second gate connection part 57, thereby forming a comb-like unit gate electrode. Each unit gate electrode is provided in a common gate layer. The first gate connection part 56 serves as the gate terminal of the high-side switching element M1, and the second gate connection part 57 serves as the gate terminal of the high-side switching element M2. Each gate connection part is connected to the high-side drive circuit 25 (refer to FIG. 1).

The drain wiring 51 includes drain connection parts 51a provided for respective first transistor arrays Ar1 and a drain interconnection part 51b for electrically connecting the drain connection parts 51a to each other, and is formed into a comb shape. Each drain connection part 51a extends in the X direction and electrically connects contacts 37a to each other in a corresponding first transistor array Ar1. The drain interconnection part 51b extends in the Y direction and is integrally formed with one end of each drain connection part 51a.

The source wiring 52 includes source connection parts 52a provided for respective second transistor arrays Ar2 and a source interconnection part 52b for electrically connecting the source connection part 52a to each other, and is formed into a comb shape. Each source connection part 52a extends in the X direction and electrically connects the contacts 37b to each other in a corresponding second transistor array Ar2. The source interconnection part 52b extends in the Y direction and is integrally formed with one end of the source connection part 52a on the side opposite to the drain interconnection part 51b. The source wiring 52 and the drain wiring 51 are formed in the same metal wiring layer.

The drain interconnection part 51b serves as the drain terminal of the high-side switching element M1 and is connected to the high-voltage line Lp1 (refer to FIG. 1). The source interconnection part 52b serves as the source terminal of the high-side switching element M2 and is connected to the connection point Psw (refer to FIG. 1).

When the element unit 50 is viewed in plan from a direction perpendicular to the surface of the silicon substrate 38, it is desired that the drain wiring 51, the source wiring 52, and the above-mentioned each unit gate electrode coincide with each other in shape and position.

In the element unit 50 configured as described above, respective transistors M1a of each first transistor array Ar1 have the drain region 33, the source region 34, and the gate electrode that are electrically connected using the same one to constitute one high-side switching element M1. Similarly, respective transistors M2a of each second transistor array Ar2 have the drain region 33, the source region 34, and the gate electrode that are electrically connected using the same one to constitute one high-side switching element M2. Since the drain region 33 of each transistor M1a and the source region 34 of each transistor M2a are electrically connected via the impurity diffusion layer of the silicon substrate 38A, the entire configuration of the element unit 50 is a series circuit of the high-side switching element M1 and the high-side switching element M2 in which the source terminal of the high-side switching element M1 and the drain terminal of the high-side switching element M2 are connected.

In the above-mentioned element unit 50, the first transistor array Ar1 and the second transistor array Ar2 are alternately arranged, so that the semiconductor pillar 31a of the transistor M1a is surrounded closely by the semiconductor pillars 31b of the plurality of transistors M2a. Similarly, the semiconductor pillar 31b of the transistor M2a is surrounded closely by the semiconductor pillars 31a of the plurality of transistors M1a. Therefore, on the surface of the silicon substrate 38A (impurity diffusion layer), the distance between a portion contacting with the end face of the semiconductor pillar 31a of the transistor M1a and a portion contacting with the end face of the semiconductor pillar 31b of the transistor M2a becomes shorter. The semiconductor pillars 31a and 31b are brought into a one-to-multiple connection state via the impurity diffusion layer. As a result, the parasitic resistance component of the impurity diffusion layer between the source region 34 of each semiconductor pillar 31a and the drain region 33 of the semiconductor pillar 31b connected via the silicon substrate 38A becomes smaller.

As mentioned above, since the parasitic resistance component of the impurity diffusion layer between the source region 34 of each semiconductor pillar 31a and the drain region 33 of the semiconductor pillar 31b becomes smaller, the series resistance between the source of the high-side switching element M1 and the drain of the high-side switching element M2 (hereinafter, referred to as "source-drain series resistance) can be suppressed to be lower, and as a result the efficiency of the converter 10 can be improved.

Further, in this example, since the heights of the semiconductor pillars 31a and 31b are the same as mentioned above, the distances from the semiconductor pillars 31a and 31b to the drain wiring 51 and the source wiring 52 provided in a common wiring layer are the same and the heights of the contacts 37a and 37b are the same. As a result, because it is unnecessary to increase the height of either one of the contacts 37a and 37b, the contact resistance can be reduced.

Since the source-drain series resistance can be suppressed to be lower correspondingly, the efficiency of the converter 10 can be further improved.

Figure 13:
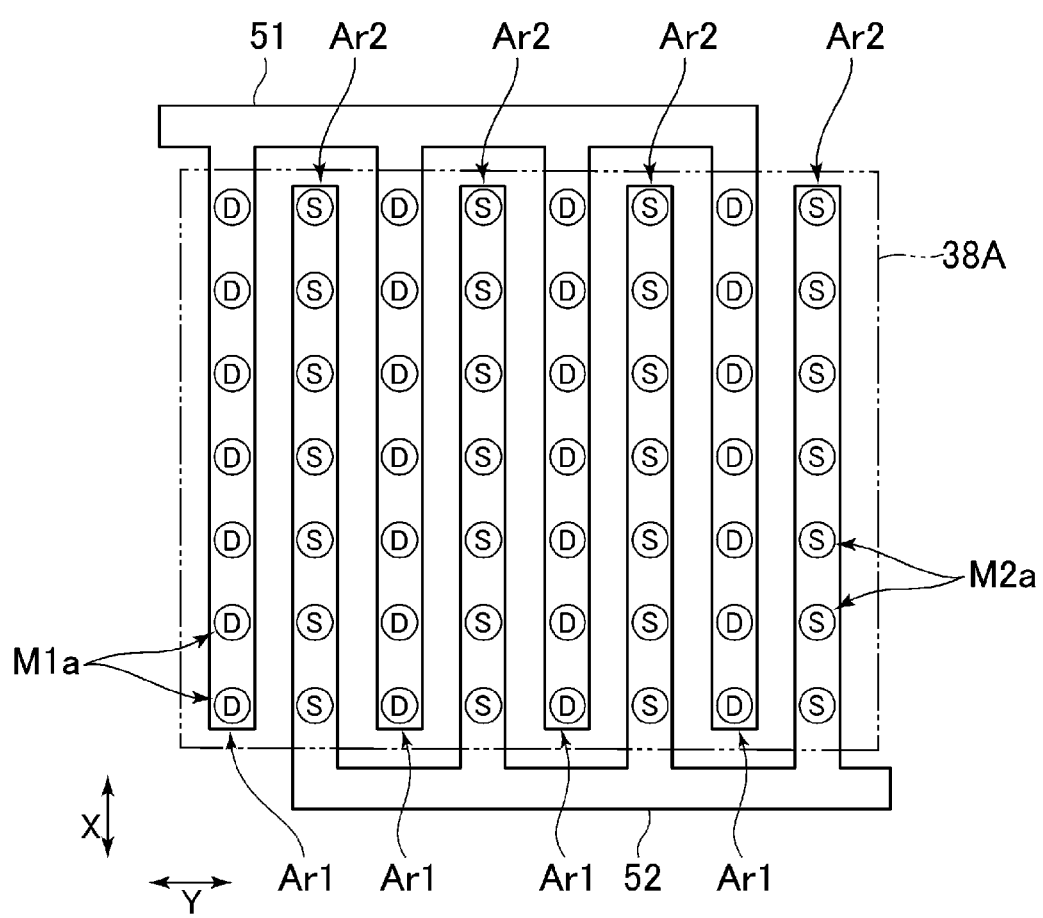
FIG. 13 illustrates an example of the element unit including transistors arranged in a 7×8 matrix pattern.
Figure 14:
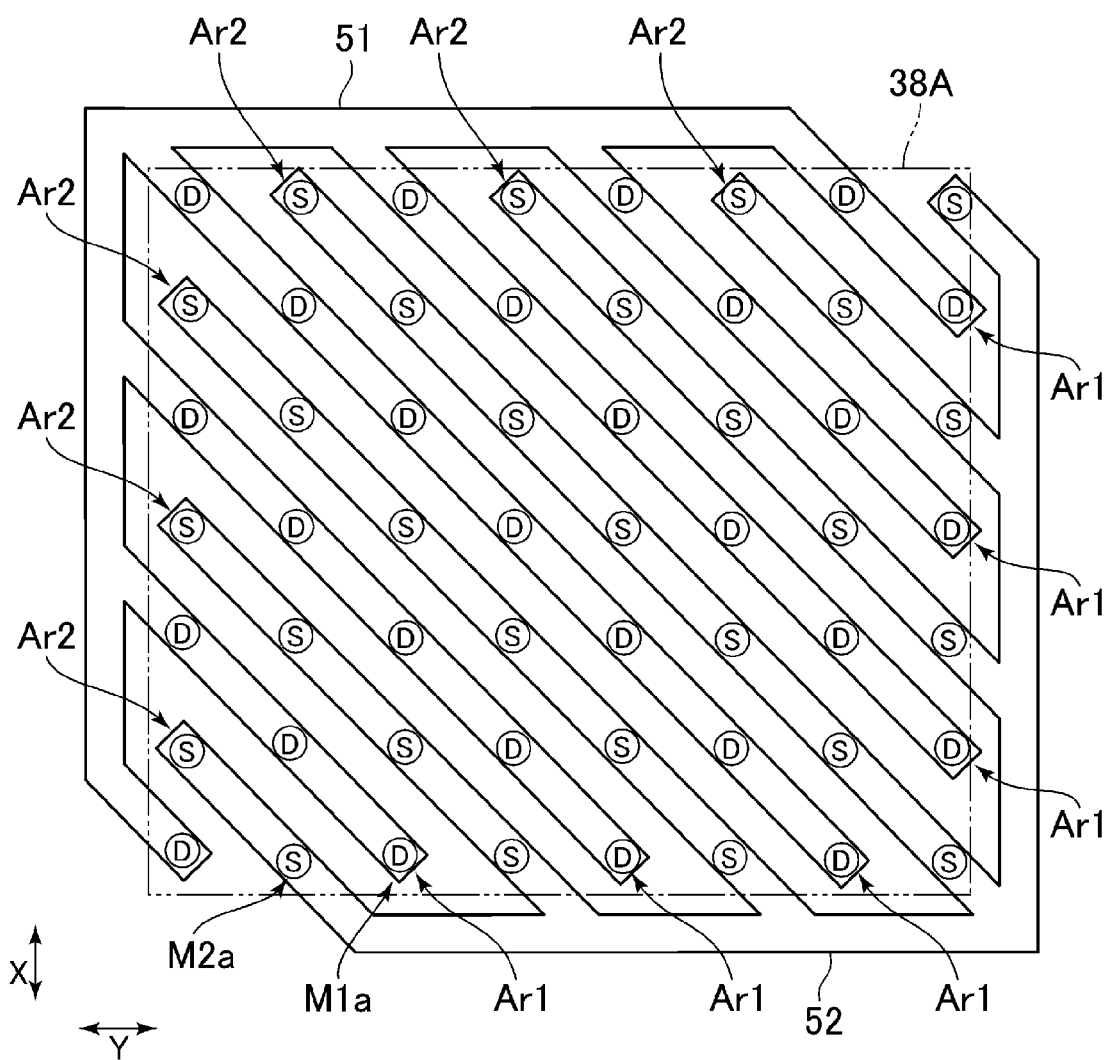
FIG. 14 illustrates an example of the 7×8 matrix in which each transistor array is inclined.

Although the above example has been described based on the configuration including the transistors arranged in the 4×4 matrix pattern, the arrangement of the transistors is not limited to this example. FIG. 13 illustrates transistors M1a and M2a arranged in a 7×8 matrix pattern, in which four rows are first transistor arrays Ar1 each extending in the X direction and the remaining four rows are second transistor arrays Ar2 each extending in the X direction. Seven transistors M1a and M2a are provided in each of the first transistor arrays Ar1 and the second transistor arrays Ar2. FIG. 14 illustrates transistors M1a and M2a arranged in a 7×8 matrix pattern like the example illustrated in FIG. 13, although first transistor arrays Ar1 and second transistor arrays Ar2 are inclined by 45 degrees with respect to the X direction. According to the example illustrated in FIG. 14, the first transistor arrays Ar1 and the second transistor arrays Ar2, which are differentiated in the number of transistors M1a and M2a, are provided. Further, for example, the first transistor array Ar1 and the second transistor array Ar2 may be provided one by one so that they are arranged adjacent to each other. In FIGS. 13 and 14, the character "D" is attached to each transistor M1a and the character "S" is attached to each transistor M2a.

Figure 15:
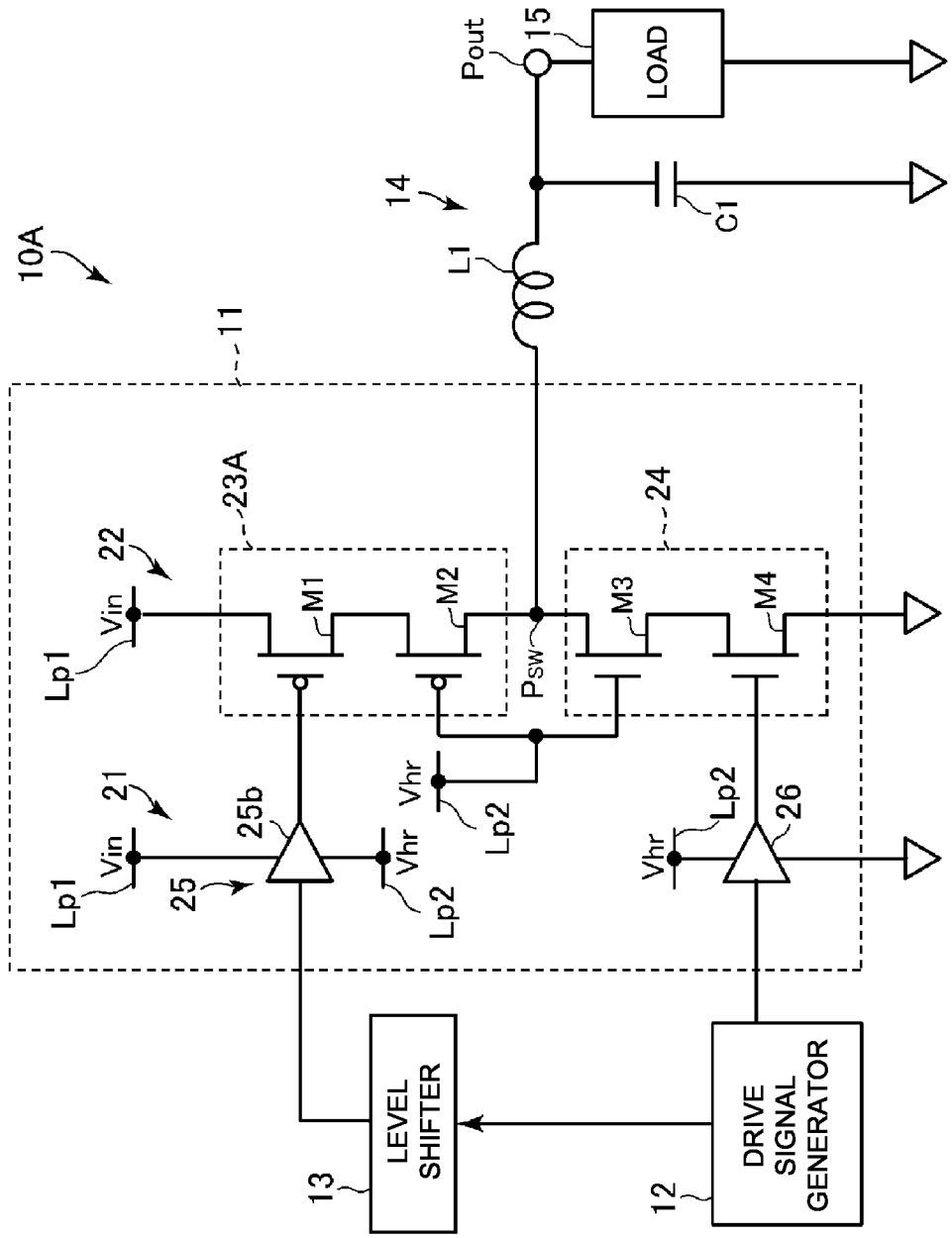
FIG. 15 is a circuit diagram illustrating a circuit configuration of a step-down DC-DC converter in which each high-side switching element has a p-type MOSFET.

The element unit using the multi-pillar type vertical BC-MOSFETs as mentioned above is useful in that the source-drain series resistance can be suppressed to be lower even in a configuration in which the high-side switching elements M1 and M2 are p-type MOSFETs connected in series, as exemplarily illustrated in FIG. 15. A converter 10A illustrated in FIG. 15 includes an HSW circuit 23A in which the high-side switching elements M1 and M2 are p-type MOSFETs connected in series. A source terminal of the high-side switching element M1 is connected to the high-voltage line Lp1. A drain terminal of the high-side switching element M1 and a source terminal of the high-side switching element M2 are connected to each other. A drain terminal of the high-side switching element M2 is connected to the connection point Psw. Further, the high-side switching element M1 has a gate terminal connected to the high-side drive circuit 25. The high-side switching element M2 has a gate terminal connected to the drive power source line Lp2. In this example, no bootstrap circuit is provided in the high-side drive circuit 25. A circuit body part 25b including a buffer has a pair of power supply terminals to which the input voltage Vin and the drive voltage Vhr are input. The converter 10A is like the converter 10 illustrated in FIG. 1 in the remaining configuration, and substantially the same members are denoted by the same reference numerals.

In this case, in the semiconductor pillars of the transistors configuring the high-side switching elements M1 and M2, the semiconductor region serving as a channel of the central portion thereof is n-type and the drain region and the source region at one end and the other end are p-type. Further, the semiconductor pillar of each transistor serving as the high-side switching element M1 is in a state where the drain region thereof is connected to one surface of the silicon substrate. The semiconductor pillar of each transistor serving as the high-side switching element M2 is in a state where the source region thereof is connected to one surface of the silicon substrate on which the impurity diffusion layer is formed. These pillars are provided in a stand-up posture on one surface of the silicon substrate 38A. Further, the semiconductor pillar of each transistor serving as the high-side switching element M1 is electrically connected to the source wiring, and the semiconductor pillar of each transistor serving as the high-side switching element M2 is electrically connected to the drain wiring. The impurity diffusion layer of the silicon substrate is doped with p-type impurities.

A simulation of changes in efficiency with respect to changes in load current of the converter 10 using the above-mentioned element unit 50 was performed as example 1. In this example 1, the bootstrap circuit 25a of the converter 10 has the circuit configuration illustrated in FIG. 11 in which the p-type MOSFET is used as the switching element M6. Further, the element unit 50 has the transistors M1a and M2a arranged in the 7×8 matrix pattern illustrated in FIG. 13.

Further, a similar efficiency simulation for the converter 10A illustrated in FIG. 15 was performed as reference example 1. In the element unit in this reference example 1, respective transistors M1a and M2a are p-type MOSFETs, although other arrangement conditions and the like are the same as in the example 1.

Figure 16:
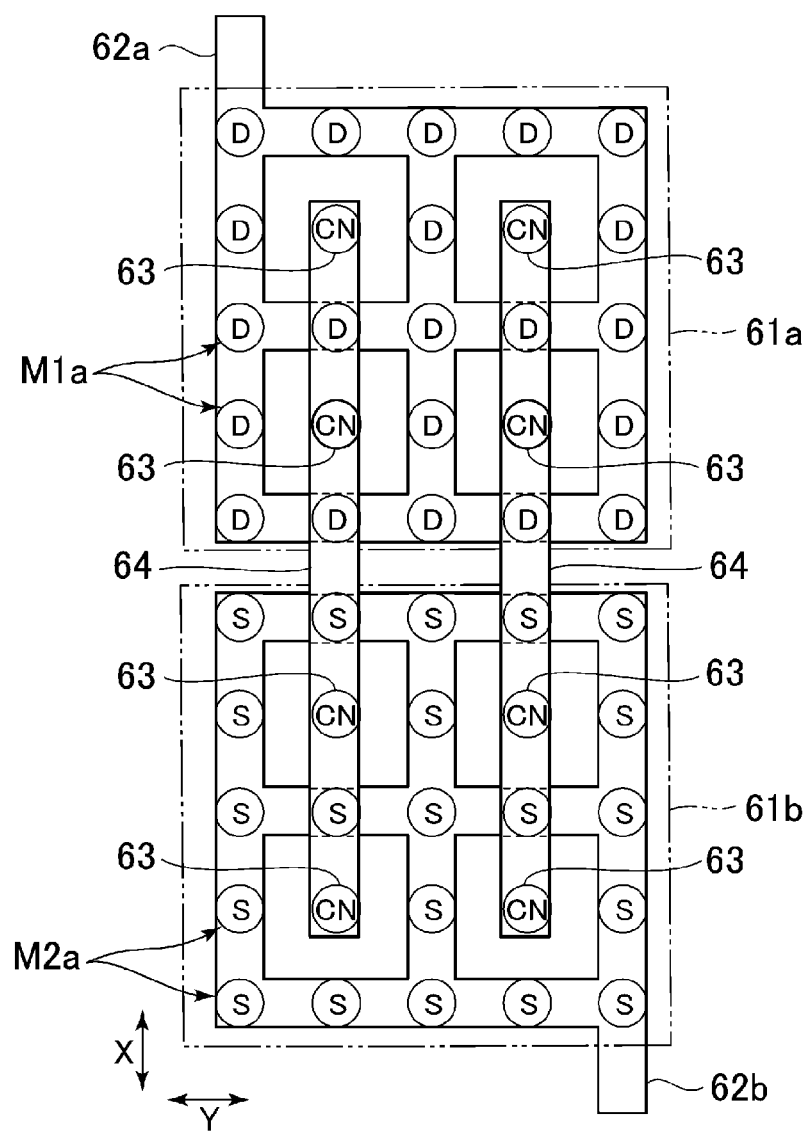
FIG. 16 schematically illustrates an element unit according to reference example 2.

In addition, similar efficiency simulation for a circuit like the example 1 but using an element unit 60 having multi-pillar type vertical BC-MOSFETs illustrated in FIG. 16 was performed as reference example 2. In FIG. 16, the character "D" is attached to each transistor M1a and the character "S" is attached to each transistor M2a. An impurity diffusion region 61a on the substrate and an impurity diffusion region 61b electrically separated from the impurity diffusion region 61a are provided in the element unit 60. In the impurity diffusion region 61a, the transistor M1a is provided at each of 21 spots on a rectangular circumference and a cross-shaped center line among portions that can be arranged into 5×5 matrix patterns, and intermediate connection points 63 are provided at the remaining four arrangeable spots. In the transistors M1a, upper drain regions of the semiconductor pillars are mutually connected via contacts by a drain wiring 62a, and lower source regions are directly connected to the impurity diffusion region 61a.

Similarly, in the impurity diffusion region 61b, the transistor M2a is provided at each of 21 spots among portions that can be arranged into 5×5 matrix patterns and intermediate connection points 63 are provided at the remaining four arrangeable spots. In the transistors M2a, source regions of the semiconductor pillars are mutually connected via contacts by a source wiring 62b, and lower drain regions are directly connected to the impurity diffusion region 61b.

Each intermediate connection point 63 provided in the impurity diffusion region 61a is electrically connected to the impurity diffusion region 61a, and each intermediate connection point 63 provided in the impurity diffusion region 61b is electrically connected to the impurity diffusion region 61b. The impurity diffusion region 61a and the impurity diffusion region 61b are electrically connected when the intermediate connection points 63 of the impurity diffusion region 61a and the intermediate connection points 63 of the impurity diffusion region 61b are connected by two wirings 64. In the element unit 60 configured as described above, each transistor M1a in the impurity diffusion region 61a operates as the high-side switching element M1 and each transistor M2a in the impurity diffusion region 61b operates as the high-side switching element M2, in a state where these are connected in series by the wirings 64. The configurations of respective transistors M1a and M2a in the impurity diffusion regions 61a and 61b are described in detail in the literature "K. Sakui and T. Endoh, "A Compact Space and Efficient Drain Current Design for Multipillar Vertical MOSFETs", IEEE TRANSACTIONS ON ELECTRON DEVICES, 2010 VOL. 57, NO. 8, p. 1768-1773".

Further, a similar efficiency simulation for the converter 10A illustrated in FIG. 15, in which the configuration is like the above-mentioned element unit 60 and the high-side switching elements M1 and M2 are p-type MOSFETs, was performed as reference example 3.

Table 1 shows the input voltage Vin, the drive voltage Vhr, the output voltage Vout, the inductance of the choke coil L1, and the static capacitance of the capacitor C1 in the simulation, as well as the static capacitance of the bootstrap capacitor Cb, the crossover frequency, and the switching frequency (fsw) in the example 1 and the reference examples 1 to 3. The transistor model adopted as the transistors M1a and M2a is BSIM4 60 nm vertical BC-MOSFET that was experimentally extracted.

TABLE 1

| | |
|---|---|
| Input voltage Vin | 2.0 V |
| Half-rail voltage Vhr | 1.0 V |
| Output voltage Vout | 0.8 V |
| Inductance (L1) | 4 nH |
| Output capacitance (C1) | 10 μF |
| Bootstrap capacitance(Cb) (High-side NMOS only) | 400 pF |
| Crossover frequency | 10 MHz |
| Switching frequency fsw | 100 MHz |
| MOSFET model | BSIM4 60 nm Vertical BC MOSFET model extracted from experimental data. |

Figure 17:
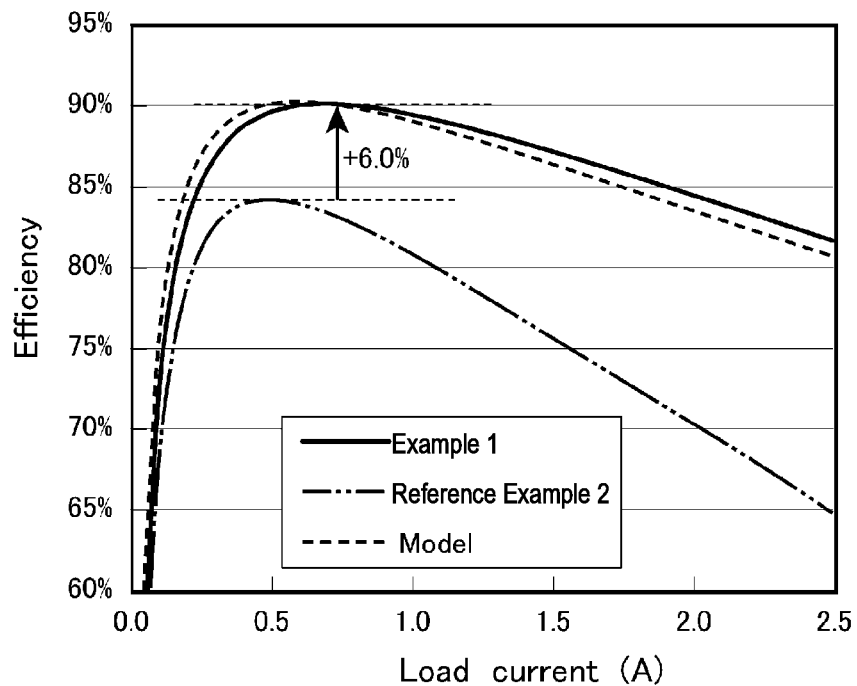
FIG. 17 is a graph illustrating simulation results of changes in efficiency with respect to changes in load in example 1 and reference example 2.
Figure 18:
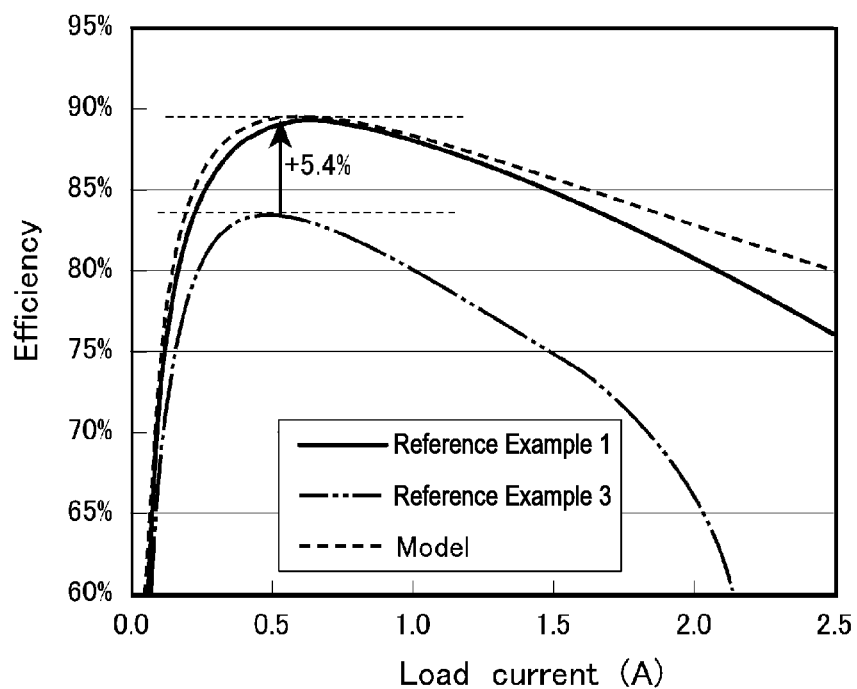
FIG. 18 is a graph illustrating simulation results of changes in efficiency with respect to changes in load in reference example 1 and reference example 3.

FIG. 17 illustrates simulation results of the above-mentioned example 1 and the reference example 2, and FIG. 18 illustrates simulation results of the above-mentioned reference example 1 and the reference example 3. In each graph of FIGS. 17 and 18, the horizontal axis represents the load current (A) and the vertical axis represents the efficiency (%). FIGS. 17 and 18 also illustrate changes in efficiency according to theoretical models (MODEL) of the example 1 and the reference example 1. The efficiency is given as in the first embodiment.

The table 2 shows the cell area factor ($F^2$), the peak efficiency obtained by simulation, and the efficiency under heavy load (load current=2 A) in each of the example 1 and the reference examples 1 to 3. In the table 2, the numbers in parentheses in the columns of the example 1 and the reference example 1 indicate increments when compared with the reference example 2 for the example 1 and increments when compared with the reference example 3 for the reference example 1, in which the numbers of the cell area factor indicate reduction rates.

TABLE 2

| | Example 1 | Reference Example 2 | Reference Example 1 | Reference Example 3 |
|---|---|---|---|---|
| Area of M1-M4 ($F^2$) | 1,901,200 (−16%) | 2,263,333 | 2,376,120 (−16%) | 2,828,715 |
| Peak | 90.1% (+6.0%) | 84.1% | 89.0% (+5.4%) | 83.6% |

TABLE 2-continued

|  | Example 1 | Reference Example 2 | Reference Example 1 | Reference Example 3 |
|---|---|---|---|---|
| efficiency Efficiency at IO = 2 A | 84.5% (+14.1%) | 70.4% | 80.9% (+15.4%) | 65.5% |

As understood from the above simulation results, when comparing the example 1 and the reference example 1 and when comparing the reference example 2 and the reference example 3, that is, when comparing the case of using n-type MOSFETs and the case of using p-type MOSFETs as the high-side switching elements M1 and M2 in the similar circuit, it is understood that the peak efficiency and the under-heavy-load efficiency are both higher in the case of using n-type MOSFETs.

Further, when comparing the example 1 and the reference example 2 in which the high-side switching elements M1 and M2 are n-type MOSFETs, the example 1 brings an improvement of 6.0% in peak efficiency and an improvement of 14.1% in under-heavy-load efficiency. Further, when comparing the reference example 1 and the reference example 3 in which the high-side switching elements M1 and M2 are p-type MOSFETs, the reference example 1 brings an improvement of 5.4% in peak efficiency and an improvement of 15.4% in under-heavy-load efficiency. It is considered that this improvement in efficiency is brought by the configuration such as the element unit 50 in which the parasitic resistance component of the impurity diffusion layer becomes smaller between respective semiconductor pillars of the transistors M1a and M2a. In addition, it is understood that the cell area factors of the example 1 and the reference example 1 are smaller by 16% than those of the reference example 2 and the reference example 3, respectively, and it is advantageous in reducing the circuit area.

In the above description, the element unit is used in the HSW circuit of the converter. However, the element unit is not limited to the illustrated example and can be used for series connection of transistor elements of the same polarity, namely, for connecting n-type MOS transistor elements in series, or for connecting p-type MOS transistor elements in series.

Although the switching circuit device is applied to the synchronous rectification type step-down DC-DC converter in each of the above-mentioned embodiments, the switching circuit device can also be used for an I/O circuit, a power gating circuit, a level shifter circuit, a current mirror circuit, and a transconductance amplifier circuit.

REFERENCE SIGNS LIST

10: step-down DC-DC converter
11: switching circuit part
14: smoothing circuit
25: high-side drive circuit
25a: bootstrap circuit
26: low-side drive circuit
38, 38A: silicon substrate
50: element unit
Ar1, Ar2: transistor array
Cb: bootstrap capacitor
M1, M2: high-side switching element
M1a, M2a: transistor
M3, M4: low-side switching element
M5, M6: switching element

The invention claimed is:

1. A switching circuit device comprising:
a high-side switching element circuit including first and second high-side switching elements connected in series between an output terminal and a high-voltage terminal of a high voltage source, the first high-side switching element being closer to the high-voltage terminal and the second high-side switching element being closer to the output terminal, each of the first and second high-side switching elements having an n-type metal-oxide-semiconductor field-effect transistor;
a low-side switching element circuit including first and second low-side switching elements connected in series between the output terminal and a reference potential terminal, each of the first and second low-side switching elements having an n-type metal-oxide-semiconductor field-effect transistor;
a high-side drive circuit configured to turn on and off the second high-side switching element;
a low-side drive circuit configured to turn on and off the first and second low-side switching elements; and
a bootstrap circuit provided in the high-side drive circuit and having a bootstrap capacitor, the bootstrap capacitor having:
a first terminal connected only to a gate terminal of the first high-side switching element regarding the high-side switching element circuit; and
a second terminal connected to the output terminal,
the bootstrap capacitor being configured to:
be connected to a drive power source and charged while the first and second low-side switching elements are ON; and
apply a gate voltage to the gate terminal of the first high-side switching element while the first and second low-side switching elements are OFF, the gate voltage being defined by adding a voltage of the output terminal to a voltage between the first and second terminals of the bootstrap capacitor.

2. A step-down DC-DC converter comprising:
the switching circuit device according to claim 1; and
a smoothing part including a capacitor and a choke coil connected to the output terminal.

3. A switching circuit device, comprising:
a high-side switching element circuit including a high-side switching element connected between an output terminal and a high-voltage terminal of a high voltage source, the high-side switching element having an n-type metal-oxide-semiconductor field-effect transistor, the high-side switching element having a structure including:
a semiconductor pillar including: a p-type semiconductor region as a channel at a central portion of the semiconductor pillar; an n-type drain region at a first end of the semiconductor pillar; and an n-type source region at a second end of the semiconductor pillar;
a gate electrode provided around the central portion of the semiconductor pillar; and a gate insulation film provided between the gate electrode and the semiconductor pillar;
a low-side switching element circuit including a low-side switching element connected between the output terminal and a reference potential terminal, the low-side switching element having an n-type metal-oxide-semiconductor field-effect transistor;
a high-side drive circuit configured to turn on and off the high-side switching element; and
a low-side drive circuit configured to turn on and off the low-side switching element; and
a bootstrap circuit provided in the high-side drive circuit and having a bootstrap capacitor, the bootstrap capacitor being configured to:
be connected to a drive power source and charged while the low-side switching element is ON; and
apply a gate voltage to the high-side switching element while the low-side switching element is OFF, the gate voltage being defined by adding a voltage of the output terminal to a voltage between first and second terminals of the bootstrap capacitor.

4. A switching circuit device comprising:
a high-side switching element circuit including first and second high-side switching elements connected in series between an output terminal and a high-voltage terminal of a high voltage source, each of the first and second high-side switching elements having an n-type metal-oxide-semiconductor field-effect transistor;
a low-side switching element circuit including first and second low-side switching elements connected in series between the output terminal and a reference potential terminal, each of the first and second low-side switching elements having an n-type metal-oxide-semiconductor field-effect transistor;
a high-side drive circuit configured to turn on and off the first and second high-side switching elements;
a low-side drive circuit configured to turn on and off the first and second low-side switching elements; and
a bootstrap circuit provided in the high-side drive circuit and having a bootstrap capacitor, the bootstrap capacitor being configured to:
be connected to a drive power source and charged while the first and second low-side switching elements are ON; and
supply a gate voltage of the first and second high-side switching elements while the first and second low-side switching elements are OFF, the gate voltage being defined by adding a voltage of the output terminal to a voltage between first and second terminals of the bootstrap capacitor, wherein
in the high-side switching element circuit:
a drain terminal of the first high-side switching element is connected to the high-voltage terminal of the high voltage source;
a source terminal of the first high-side switching element is connected to a drain terminal of the second high-side switching element;
a source terminal of the second high-side switching element is connected to the output terminal; and
a gate terminal of the second high-side switching element is connected to a high-voltage terminal of the drive power source,
the bootstrap circuit includes a switching circuit in addition to the bootstrap capacitor, the switching circuit being turned on when the first and second low-side switching elements are ON,
the first terminal of the bootstrap capacitor is connected to a gate terminal of the first high-side switching element, and the second terminal of the bootstrap capacitor is connected to the output terminal,
the switching circuit is connected between the high-voltage terminal of the drive power source and a connection point of the first terminal of the bootstrap capacitor and the gate terminal of the first high-side switching element, and
the high-side drive circuit is configured to apply the gate voltage generated from the voltage between the first and second terminals of the bootstrap capacitor, with the output terminal as a reference potential, to the second high-side switching element to turn on the second high-side switching element, thereby turning on the first high-side switching element in response to turning-on of the second high-side switching element.

5. The switching circuit device according to claim 4, wherein
the switching circuit includes a plurality of switching elements connected in series, the plurality of switching elements including a switching element that is turned on when the first and second low-side switching elements are turned on, and
turning-on of the switching element of the plurality of switching elements causes turning-on of another switching element of the plurality of switching elements.

6. A switching circuit device comprising:
a high-side switching element circuit including first and second high-side switching elements connected in series between an output terminal and a high-voltage terminal of a high voltage source, each of the first and second high-side switching elements having an n-type metal-oxide-semiconductor field-effect transistor;
a low-side switching element circuit including first and second low-side switching elements connected in series between the output terminal and a reference potential terminal, each of the first and second low-side switching elements having an n-type metal-oxide-semiconductor field-effect transistor;
a high-side drive circuit configured to turn on and off the first and second high-side switching elements;
a low-side drive circuit configured to turn on and off the first and second low-side switching elements; and
a bootstrap circuit provided in the high-side drive circuit and having a bootstrap capacitor, the bootstrap capacitor being configured to:
be connected to a drive power source and charged while the first and second low-side switching elements are ON; and
supply a gate voltage to the first and second high-side switching elements while the first and second low-side switching elements are OFF, the gate voltage being defined by adding a voltage of the output terminal to a voltage between first and second terminals of the bootstrap capacitor, wherein
the high-side switching element circuit comprises:
a substrate having one surface on which an impurity diffusion layer is provided;
a first transistor array serving as the first high-side switching element, the first transistor array including:
a plurality of first semiconductor pillars aligned in a line in a first direction, each first semiconductor pillar including: a p-type semiconductor region as a channel provided at a central portion of each first semiconductor pillar; an n-type drain region provided at a first end of each first semiconductor pillar; and an n-type source region provided at a second end of each first semiconductor pillar such that the n-type source region is connected to the impurity diffusion layer;

a first array gate electrode surrounding central portions of the plurality of first semiconductor pillars; and a plurality of gate insulation films respectively provided between the plurality of first semiconductor pillars and the first array gate electrode;

a second transistor array serving as the second high-side switching element, the second transistor array including:

a plurality of second semiconductor pillars aligned in a line in the first direction, each second semiconductor pillar including: a p-type semiconductor region as a channel provided at a central portion of each second semiconductor pillar; an n-type source region provided at a first end of each second semiconductor pillar; and an n-type drain region provided at a second end of each second semiconductor pillar such that the n-type drain region is connected to the impurity diffusion layer;

a second array gate electrode surrounding central portions of the plurality of second semiconductor pillars; and a plurality of gate insulation films respectively provided between the plurality of second semiconductor pillars and the second array gate electrode;

a drain connection part for electrically connecting respective first ends of the plurality of first semiconductor pillars; and a source connection part for electrically connecting respective first ends of the plurality of second semiconductor pillars.

7. The switching circuit device according to claim 6, comprising:

a plurality of first transistor arrays, each being defined as the first transistor array;

a plurality of second transistor arrays, each being defined as the second transistor array, the plurality of first transistor arrays and the plurality of second transistor arrays being alternately arranged in a second direction orthogonal to the first direction;

a plurality of drain connection parts, each being defined as the drain connection part, the plurality of drain connection parts being respectively provided for the plurality of first transistor arrays;

a plurality of source connection parts, each being defined as the source connection part, the plurality of source connection parts being respectively provided for the plurality of second transistor arrays;

a first gate connection part for electrically connecting a plurality of first array gate electrodes of the plurality of first transistor arrays to each other;

a second gate connection part for electrically connecting a plurality of second array gate electrodes of the plurality of second transistor arrays to each other;

a drain interconnection part for electrically connecting the plurality of drain connection parts to each other; and a source interconnection part for electrically connecting the plurality of source connection parts to each other.

8. An element unit comprising:

a substrate having one surface on which an impurity diffusion layer is provided;

a first transistor array serving as a first metal oxide semiconductor transistor element, the first transistor array including:

a plurality of first semiconductor pillars aligned in a line in a first direction, each first semiconductor pillar including: a semiconductor region as a channel provided at a central portion of each first semiconductor pillar; a drain region provided at a first end of each first semiconductor pillar; and a source region provided at a second end of each first semiconductor pillar such that the source region is connected to the impurity diffusion layer;

a first array gate electrode surrounding central portions of the plurality of first semiconductor pillars; and a plurality of gate insulation films respectively provided between the plurality of first semiconductor pillars and the first array gate electrode;

a second transistor array serving as a second metal oxide semiconductor transistor element which is identical in polarity to the first metal oxide semiconductor transistor element, the second transistor array including:

a plurality of second semiconductor pillars aligned in a line in the first direction, each second semiconductor pillar including: a semiconductor region as a channel provided at a central portion of each second semiconductor pillar; a source region provided at a first end of each second semiconductor pillar; and a drain region provided at a second end of each second semiconductor pillar such that the drain region is connected to the impurity diffusion layer;

a second array gate electrode surrounding central portions of the plurality of second semiconductor pillars; and a plurality of gate insulation films respectively provided between the plurality of second semiconductor pillars and the second array gate electrode;

a drain connection part for electrically connecting respective first ends of the plurality of first semiconductor pillars; and a source connection part for electrically connecting respective first ends of the plurality of second semiconductor pillars.

9. The element unit according to claim 8, wherein the drain connection part and the source connection part are provided in a common wiring layer.

10. The element unit according to claim 8, wherein the first array gate electrode and the second array gate electrode are provided in a common gate electrode layer.

11. The element unit according to claim 8, comprising:

a plurality of first transistor arrays, each being defined as the first transistor array;

a plurality of second transistor arrays, each being defined as the second transistor array, the plurality of first transistor arrays and the plurality of second transistor arrays being alternately arranged in a second direction orthogonal to the first direction;

a plurality of drain connection parts, each being defined as the drain connection part, the plurality of drain connection parts being respectively provided for the plurality of first transistor arrays;

a plurality of source connection parts, each being defined as the source connection part, the plurality of source connection parts being respectively provided for the plurality of second transistor arrays;
a first gate connection part for electrically connecting a plurality of first array gate electrodes of the plurality of first transistor arrays to each other;
a second gate connection part for electrically connecting a plurality of second array gate electrodes of the plurality of second transistor arrays to each other;
a drain interconnection part for electrically connecting the plurality of drain connection pars to each other; and
a source interconnection part for electrically connecting the plurality of source connection parts to each other.

\* \* \* \* \*